United States Patent [19]
Westerfield, Jr. et al.

[11] Patent Number: 6,142,726
[45] Date of Patent: Nov. 7, 2000

[54] AUTOMATED CHAMFERING METHOD

[75] Inventors: Robert Peter Westerfield, Jr., Montgomery; Thomas Gerard Jantz; Robert Paul Kuder, II, both of Hopewell Junction; David Clyde Linnell, Poughkeepsie; Robert Albert Meyen, Salt Point, all of N.Y.

[73] Assignee: International Business Machines Corporation, Armonk, N.Y.

[21] Appl. No.: 09/250,464

[22] Filed: Feb. 16, 1999

Related U.S. Application Data

[62] Division of application No. 08/966,622, Nov. 10, 1997, Pat. No. 5,984,608, which is a division of application No. 08/629,300, Apr. 8, 1996, Pat. No. 5,752,797.

[51] Int. Cl.$^7$ .............................. B65G 65/00; B23C 3/12
[52] U.S. Cl. .................................................. 414/808
[58] Field of Search ........................ 414/808, 403, 414/416, 407, 417; 198/465.1, 465.2

[56] References Cited

U.S. PATENT DOCUMENTS

| | | |
|---|---|---|
| 3,977,298 | 8/1976 | Linsinger . |
| 4,031,667 | 6/1977 | Sehestedt . |
| 4,364,696 | 12/1982 | Syarto et al. . |
| 4,618,305 | 10/1986 | Cedrone et al. . |
| 4,763,811 | 8/1988 | Mae et al. . |
| 4,810,154 | 3/1989 | Klemmer et al. . |
| 4,952,109 | 8/1990 | Hendricks . |
| 4,985,982 | 1/1991 | Lohr et al. . |
| 5,448,819 | 9/1995 | Grassi . |
| 5,717,713 | 2/1998 | Syde et al. . |
| 5,752,797 | 5/1998 | Westerfield, Jr. et al. ............. 414/403 |
| 5,984,608 | 11/1999 | Westerfield, Jr. et al. ............. 414/403 |

*Primary Examiner*—Christopher P. Ellis
*Assistant Examiner*—Khoi H. Tran
*Attorney, Agent, or Firm*—DeLio & Peterson LLC; Robert Curcio; Aziz M. Ahsan

[57] ABSTRACT

An apparatus for loading, chamfering and unloading a ceramic or ceramic/polymer substrate for electronic components. An automatic part loader moves substrates in a row as a unit, using a frangible pin to push the parts. The part loader separates the first of the substrates from the rest, and a load pedestal pushes the first substrate up into a loading/unloading nest. The load pedestal is mounted on rods so that the substrate may move laterally to center itself in the nest. The nest then rotates to load the substrate onto a movable process pedestal. The chamfering apparatus includes a pair of spaced, rotatable cutting spindles for chamfering edges and corners on the substrate. The cutting spindles include: i) separate top and bottom edge cutters for simultaneously chamfering top and bottom of edges of a substrate secured on the carrier as the substrate passes between the spindles and ii) corner cutters for simultaneously chamfering corners of a substrate secured on the carrier as the substrate contacts the spindles. The pedestal rotates the substrate about an axis normal to the plane of the substrate and moves the substrate in a direction normal to the plane of the substrate to present unchamfered edges and corners to the cutting spindles. A disc brake on the process pedestal may be actuated to prevent rotation of the substrate during chamfering. An enclosure surrounds the substrate, chamfering cutters and process pedestal during chamfering and utilizes the air flow supplied by the rotating cutters to propel chips into a particle collector.

3 Claims, 20 Drawing Sheets

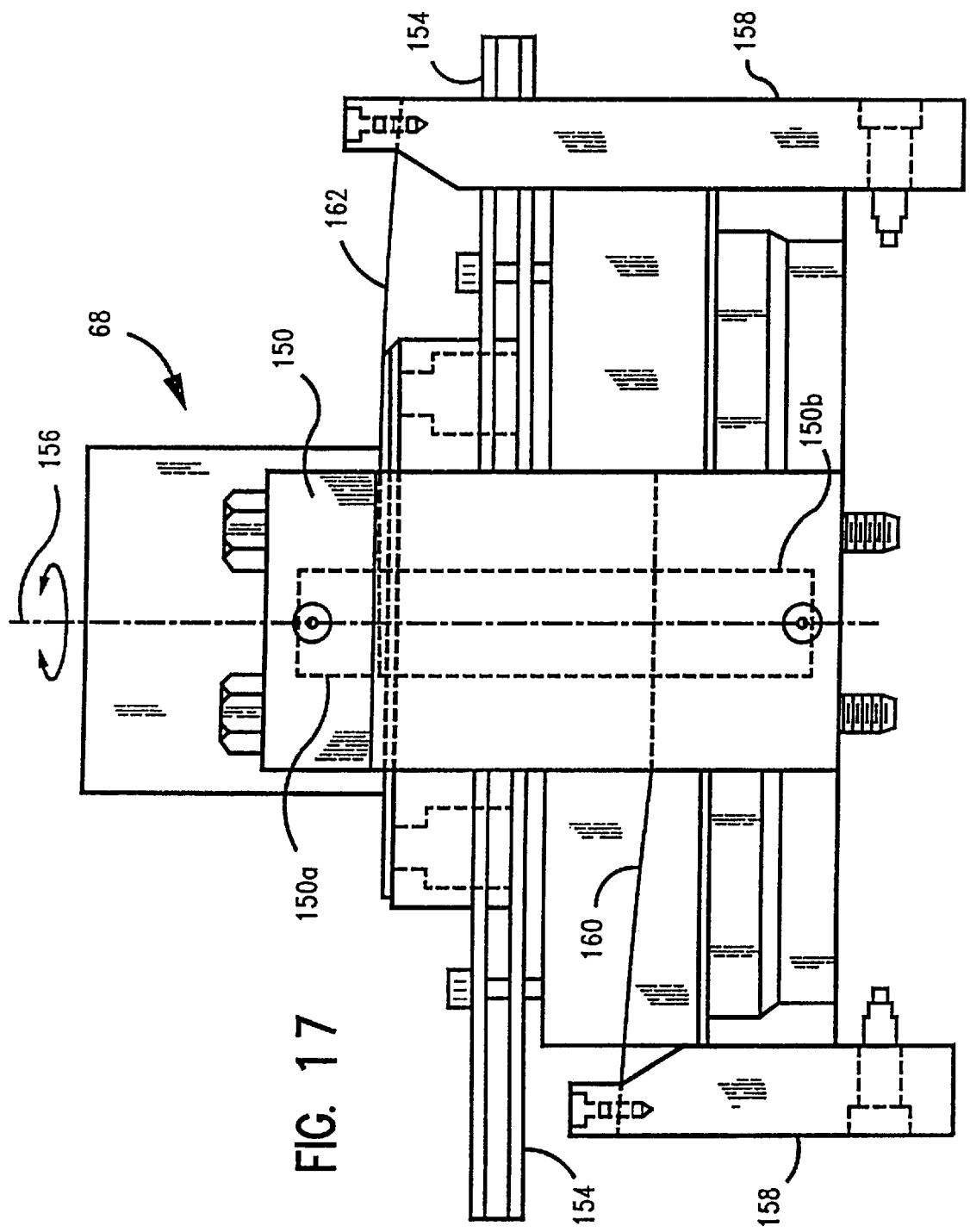

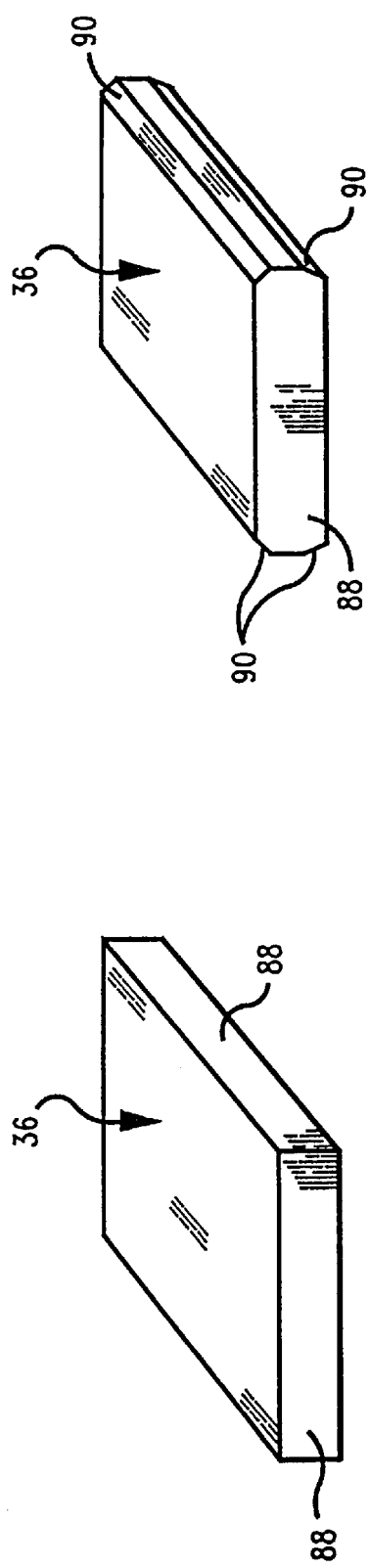
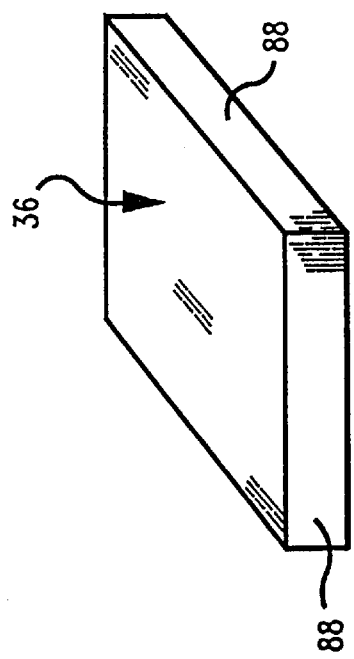
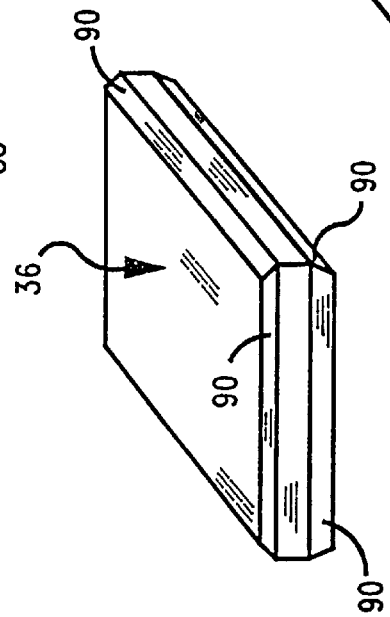
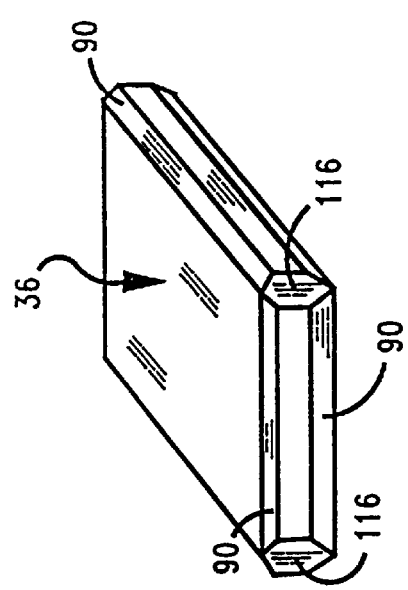
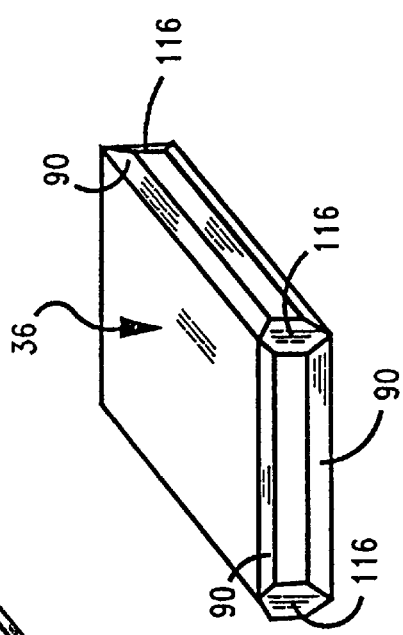

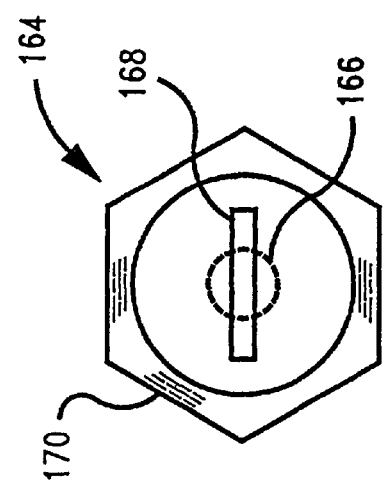
FIG. 26b
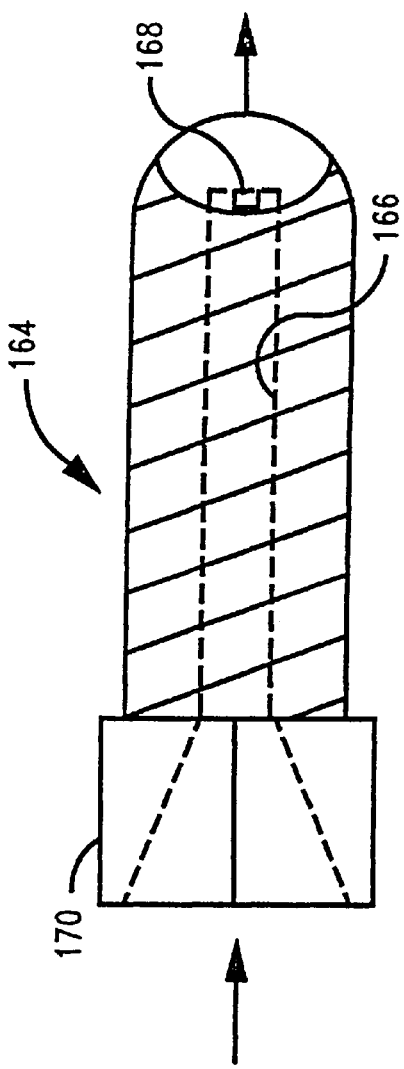
FIG. 26a
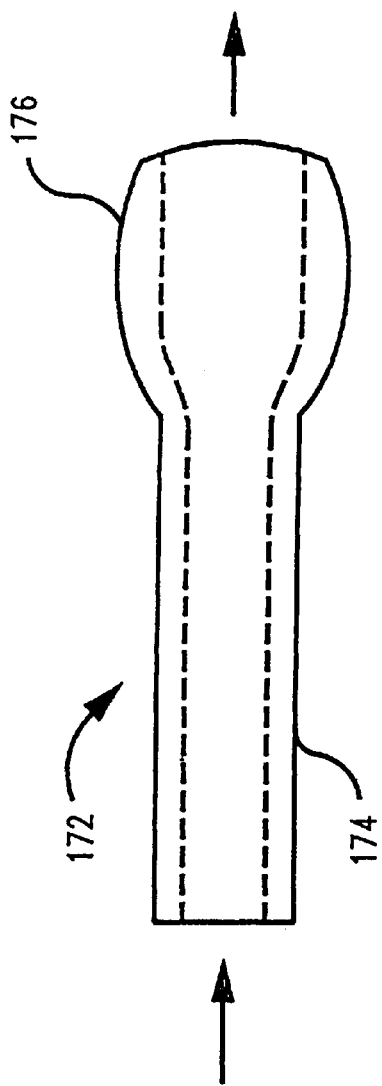
FIG. 27a
FIG. 27b

AUTOMATED CHAMFERING METHOD

This application is a divisional of Ser. No. 08/966,622 filed on Nov. 10, 1997, now U.S. Pat. No. 5,984,608, which is a divisional of U.S. patent application Ser. No. 08/629,300 filed on Apr. 8, 1996, now U.S. Pat. No. 5,752,797.

BACKGROUND OF THE INVENTION

1. Field of the Invention

The present invention is directed to an apparatus and method for chamfering edges and corners of substrates of the type used in electronic applications.

2. Background of the Invention

There has been a long felt need to provide a high-volume, low-cost, high-speed method for handling, chamfering, and cleaning unfired substrates of the type which are used in electronic applications, for example, to produce multi-layer ceramic structures typically used to make single chip modules (SCM) or multi-chip modules (MCM). These substrates may be made from ceramic or composite ceramic/polymer materials. Such substrates are generally planar and square in type plan view, with a thickness substantially less than the length and width dimensions. The edges are initially produced with approximately vertical, square edges as seen in side elevational view. The industry standard for many substrates requires the finished substrate to have eight edge chamfers (four on the top and four on the bottom) as seen in side elevational view and four corner chamfers as seen in top plan view. It would be desirable to have a tool able to apply all twelve chamfers and clean the substrate within one load/unload cycle. Further, soft ceramic/polymer composites used for substrates are vulnerable to edge delamination in multilayer packages, embedded ceramic debris, self-contamination, surface metallurgy damage, and scratching. Therefore, it is desirable not only to protect the substrate from damage, but also to clean any self-generated contamination.

Bearing in mind the problems and deficiencies of the prior art, it is therefore an object of the present invention to provide an improved apparatus and method for chamfering and cleaning substrates of the type used for electronic applications.

It is another object of the present invention to provide an apparatus and method for chamfering substrates of the type used for electronic applications whereby multiple chamfering operations are completed in one load/unload cycle.

A further object of the invention is to provide an apparatus and method for chamfering and cleaning substrates of the type used for electronic applications whereby chamfering debris is also cleaned within one load/unload cycle.

It is yet another object of the present invention to provide an apparatus and method for chamfering substrates of the type described above which utilizes conventional cutting inserts.

Still other objects and advantages of the invention will in part be obvious and will in part be apparent from the specification.

SUMMARY OF THE INVENTION

The above and other objects, which will be apparent to those skilled in the art, are provided in the present invention which, in one aspect, is directed to an apparatus for processing electronic component substrates comprising a frame; means associated with the frame for loading a substrate for processing by the apparatus; and a substrate carrier movable on frame to receive and secure the substrate during processing by the apparatus. A pair of spaced, rotatable cutting spindles are disposed on the frame for chamfering edges and corners of the substrate. The cutting spindles include i) separate top and bottom edge cutters for simultaneously chamfering top and bottom of edges of a substrate secured on the carrier as the substrate passes between the spindles and ii) corner cutters for simultaneously chamfering corners of a substrate secured on the carrier as the substrate contacts the spindles. Also included are means associated with the carrier for rotating the substrate about an axis normal to the plane of the substrate and moving the substrate in a direction normal to the plane of the substrate to present unchamfered edges and corners to the cutting spindles.

The top and bottom edge cutters are preferably located on a first level of the spindles and the corner cutters are located on a second level of the spindles, different from the first level. Also, the top edge cutters may be located on the spindle radially opposite the bottom edge cutters. With this configuration, the substrate carrier is adapted to move the substrate on a first level during edge chamfering by the top and bottom edge cutters and move the substrate on a second level, different from the first level, during corner chamfering by the corner cutters. The spindles may be adjustable toward and away from each other and are preferably adapted to simultaneously chamfer the top and bottom of opposite edges of the substrate and simultaneously chamfer adjacent corners of the substrate.

Preferably, the loading means comprises means to separate a first substrate from contact with other substrates along a plane of the substrates prior to effecting loading of the first substrate into the apparatus. In this aspect, the invention includes an apparatus for moving electronic component substrates comprising a frame and a tray on the frame for receiving a plurality of substrates in a row. There is further provided means for moving the row of substrates along the tray as a unit in a first direction and means for sensing the position of a first one of the substrates on the tray. In order to effect further process of the substrate, there is provided means for separating and spacing the first of the substrates from remaining substrates on the tray along the first direction, and means for removing the first of the substrates from the row while retaining the remaining substrates in the row. The separating and spacing means may be a jet of air or a source of vacuum applied to the substrate. Preferably, a frangible pin is connected to the moving means to urge against the row of substrates in the first direction.

In another aspect, the present invention provides an apparatus for preventing excessive movement of electronic component substrates during processing, such as during movement of the row of substrates in the loading tray. This apparatus comprises a frame, a tray on the frame for receiving a plurality of substrates in a row, and a pin for contacting a substrate at a first end of the row and pushing the substrates in a first direction of the other end of the row. The pin has a weakened portion below a region of contact with the substrate, such as a region of reduced cross-section, at which the pin will shear if subjected to a predetermined shear force in that direction. There is also provided means for moving the pin in the first direction and urging the pin against the substrates. Upon blockage of movement of the substrates in the first direction, the pin is subjected to the shear force and the pin shears to prevent excessive movement of the row of substrates.

In a further aspect, the invention relates to an apparatus for moving an electronic component substrate, such as during loading of the substrate onto the carrier for machining. This apparatus comprises a base, a substrate loading carrier for moving the substrate in a first direction, and at least one rod extending substantially in the first direction securing the substrate to the base. The rod is flexible in other directions perpendicular to the first direction so as to permit the loading carrier to adjust the position of the substrate in the other directions. Preferably, the substrate is substantially flat and has a thickness, and the apparatus further includes a carrier for receiving the substrate from the loading carrier wherein the receiving substrate has a pocket for capturing the substrate. The rods are movable to adjust the position of the substrate on the loading carrier in the other directions for alignment with the pocket on the receiving substrate carrier.

The loading means may include first means for transferring an unfinished substrate to the carrier and second means for transferring a finished substrate away from the carrier, the first and second transferring means being connected such that as the first transferring means loads an unfinished substrate the second transferring means simultaneously unloads a finished substrate.

In connection with the carrier, the present invention also provides an apparatus for securing electronic component substrates during processing comprising a frame, a substrate carrier rotatable on the frame about an axis to receive and secure the substrate during processing by the apparatus and means for rotating the substrate carrier about the axis. A brake disc is secured to and rotatable with the carrier and oriented in a plane normal to the axis, and a brake caliper is secured to the frame and engagable with the disc to prevent rotation of the substrate carrier. Preferably, the caliper is secured to the frame by a sheet oriented in the plane normal to the axis, such that the sheet permits movement of the caliper in the direction of the axis during rotation of the substrate carrier.

The apparatus may further include means for cleaning the substrate after loading the substrate into the apparatus and prior to chamfering the substrate.

In a related aspect, the present invention provides a method of processing electronic component substrates comprising initially providing an apparatus comprising a frame; a pair of spaced, rotatable cutting spindles on the frame for chamfering edges and corners of a substrate, the cutting spindles including i) separate top and bottom edge cutters for simultaneously chamfering top and bottom of edges of the substrate and ii) corner cutters for simultaneously chamfering corners of a substrate; and means associated with the carrier for rotating the substrate about an axis normal to the plane of the substrate and moving the substrate in a direction normal to the plane of the substrate to present unchamfered edges and corners to the cutting spindles. Subsequently, the method comprises simultaneously chamfering the top and bottom edges of opposite sides of the substrate, and simultaneously chamfering adjacent corners of the substrate. Preferably, the method also includes the step of rotating the substrate 90 degrees and chamfering the top and bottom edges of additional opposite sides of the substrate and the step of rotating the substrate 90 degrees and chamfering additional adjacent edges of the substrate.

In a preferred embodiment, the top and bottom edge cutters are located on a first level of the spindles and the corner cutters are located on a second level of the spindles, different from the first level, such that the method includes moving the substrate from a first level during edge chamfering by the top and bottom edge cutters to a second level, different from the first level, during corner chamfering by the corner cutters.

There may also be provided means associated with the frame for loading a row of substrates for processing by the apparatus such that the method further includes the step of separating a first substrate from contact with other substrates in the row along a plane of the substrates prior to effecting loading of the first substrate into the apparatus. In this aspect, the invention relates to a method of moving electronic component substrates for further processing comprising the steps of providing a tray for receiving a plurality of substrates in a row, moving the row of substrates along the tray as a unit in a first direction and sensing the position of a first one of the substrates on the tray. Subsequently, the method provides for the steps of separating and spacing the first of the substrates from remaining substrates on the tray along the first direction and removing the first of the substrates from the row while retaining the remaining substrates in the row. The step of separating and spacing the first of the substrates may be by applying a jet of air or a source of vacuum to the substrate. Preferably, the row of substrates is moved by urging a frangible pin against the last substrate in the row in the first direction.

In connection with the loading of the substrates, the present invention provides a method of preventing excessive movement of electronic component substrates during processing by initially providing a tray for receiving a plurality of substrates in a row and providing a pin for contacting a substrate at a first end of the row and pushing the substrates in a first direction of the other end of the row, the pin having a weakened portion at which the pin will shear if subjected to a predetermined shear force in the direction. This method then comprises the steps of: i) urging the pin against the first end of the row and moving the row of substrates along the try as a unit in the first direction; ii) blocking movement of the substrates in the first direction; and iii) shearing the pin in response to blockage of the substrates to prevent excessive movement of the row of substrates.

Another aspect of the present invention relates to a method for moving electronic component substrates for further processing, such as during loading of the substrates. To practice this aspect of the invention, there is provided a base, a substrate loading carrier for moving the substrate in a first direction; and at least one rod extending substantially in the first direction securing the substrate to the base. The rod is flexible in other directions perpendicular to the first direction so as to permit the loading carrier to adjust the position of the substrate in the other directions. Also provided is a carrier for receiving the substrate from the loading carrier, the receiving substrate having a pocket for capturing the substrate. The method involves moving the rods in the other direction to adjust the position of the substrate on the loading carrier for alignment with the pocket on the receiving substrate carrier and, subsequently, moving the loading carrier in the first direction and inserting the substrate into the pocket until the substrate is captured by the receiving carrier.

The apparatus may also include first means for loading an unfinished substrate into the apparatus and second means for unloading a finished substrate from the apparatus, the first loading and second unloading means being connected, such that the method includes simultaneously loading an unfinished substrate with the first loading means while unloading a finished substrate with the second unloading means.

With regard to operation of the substrate carrier, the invention also relates to a method of securing electronic component substrates during processing. There is first provided a frame, a substrate carrier rotatable on the frame about an axis to receive and secure the substrate during processing by the apparatus, means for rotating the substrate carrier about the axis; a brake disc secured to the carrier and oriented in a plane normal to the axis, and a brake caliper secured to the frame and actuable to prevent rotation of the substrate carrier. The method comprises the steps of: i) rotating the substrate carrier to a desired rotational position for processing of the substrate; and ii) actuating the brake caliper to engage the disc and prevent rotation of the substrate during processing. Preferably, the caliper is secured to the frame by a sheet oriented in the plane normal to the axis, such that during rotation of the substrate carrier the sheet permits movement of the caliper in the direction of the axis.

BRIEF DESCRIPTION OF THE DRAWINGS

The features of the invention to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 17 is a side elevational view of the preferred process pedestal and brake assembly of the load/unload assembly of FIG. 4.

FIGS. 20a–20e depict the edge and corner chamfers of a substrate part at various stages of processing by the automated chamfer tooling apparatus of FIG. 1.

FIGS. 26a and b depict side and end views, respectively, of a nozzle used in connection with the load/unload and chamfering subassemblies shown in FIG. 19.

FIGS. 27a and b depict side and end views, respectively, of another nozzle used in connection with the load/unload and chamfering subassemblies shown in FIG. 19.

DESCRIPTION OF THE PREFERRED EMBODIMENT(S)

Figure 1:
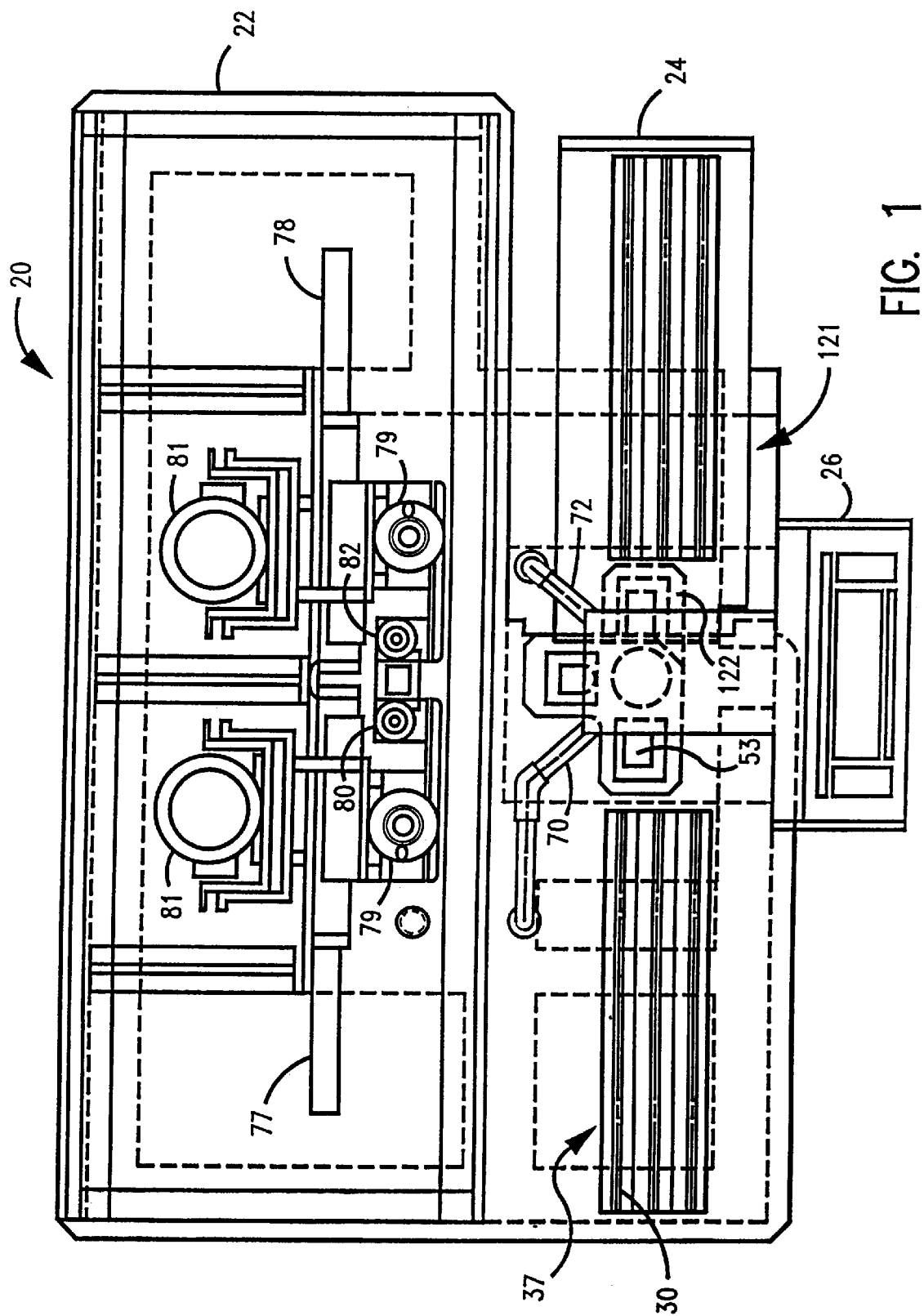
FIG. 1 is a top plan view of the preferred automated chamfer tooling apparatus of the present invention.

In describing the preferred embodiment of the present invention, reference will be made herein to FIGS. 1–27b of the drawings in which like numerals refer to like features of the invention. Features of the invention are not necessarily shown to scale in the drawings.

Figure 2:
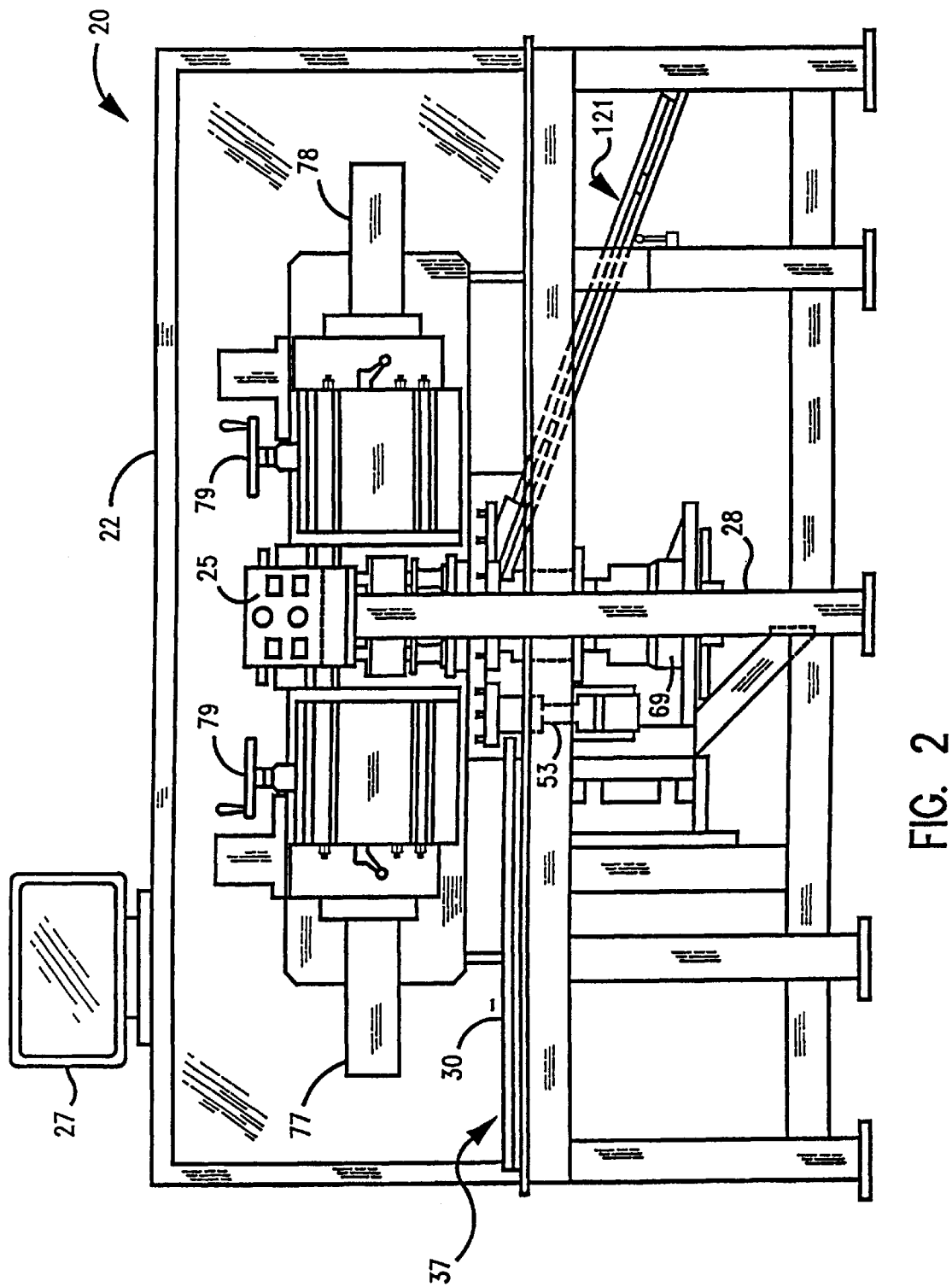
FIG. 2 is a front elevational view of the automated chamfer tooling apparatus of FIG. 1.
Figure 3:
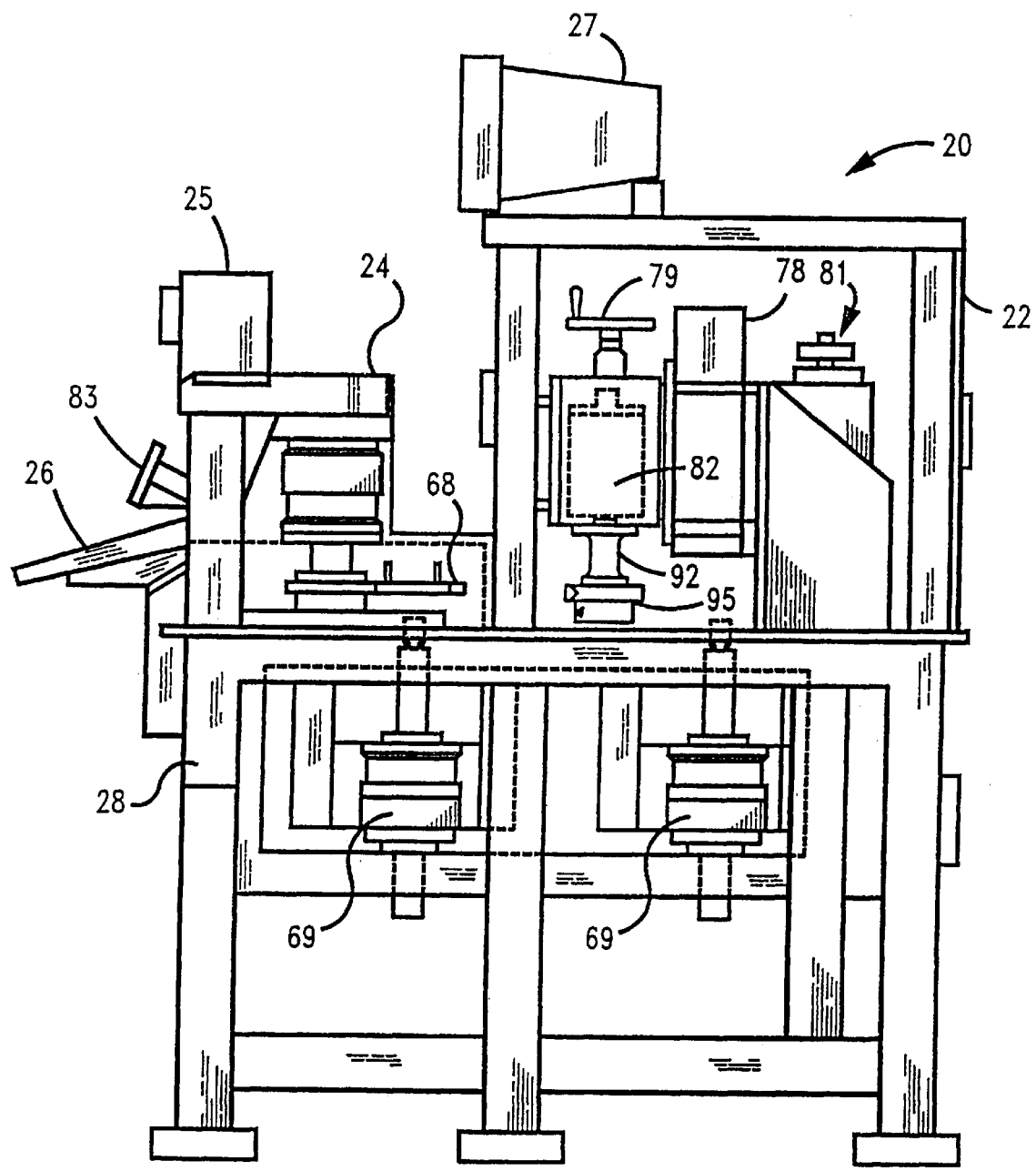
FIG. 3 is a side elevational view of the automated chamfer tooling apparatus of FIG. 1.

To address the aforementioned problems, the present invention is directed to a new and unique chamfering apparatus as shown in the accompanying drawings and explained in further detail below. FIGS. 1–3 depicts the automatic chamfer tooling apparatus in top, front and side views, respectively. Tooling apparatus 20 consists of frame 22 to which is attached the various subassemblies utilized for processing the substrates. Description of these subassemblies will be made with reference to the preferred process flow of the substrates. In operation, the preferred automated chamfer tooling apparatus employs the following process steps and/or movements:

1) tray loading
2) part loading
3) positioning of substrate for process pedestal/TSM cleaning operation
4) edge chamfering I
5) index 90 degrees
6) edge chamfering II
7) lift substrate, corner chamfer I
8) index 180 degrees, corner chamfer II
9) through cleaning station
10) lower substrate
11) remove from process pedestal
12) rotation
13) automatic unloading A control station 25, including input keyboard 26 and monitor 27, utilizes a microprocessor to control the various subassemblies during operation of the chamfering apparatus.

Tray Loading

Figure 4:
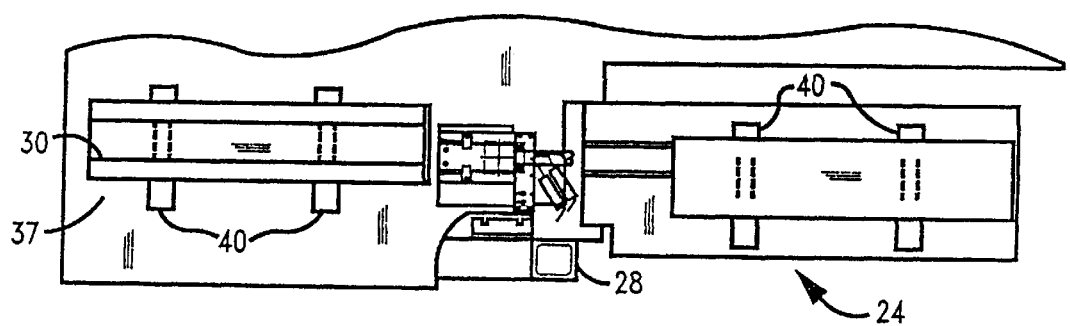
FIG. 4 is a top plan view of the preferred load/unload subassembly of the automated chamfer tooling apparatus of FIG. 1.
Figure 5:
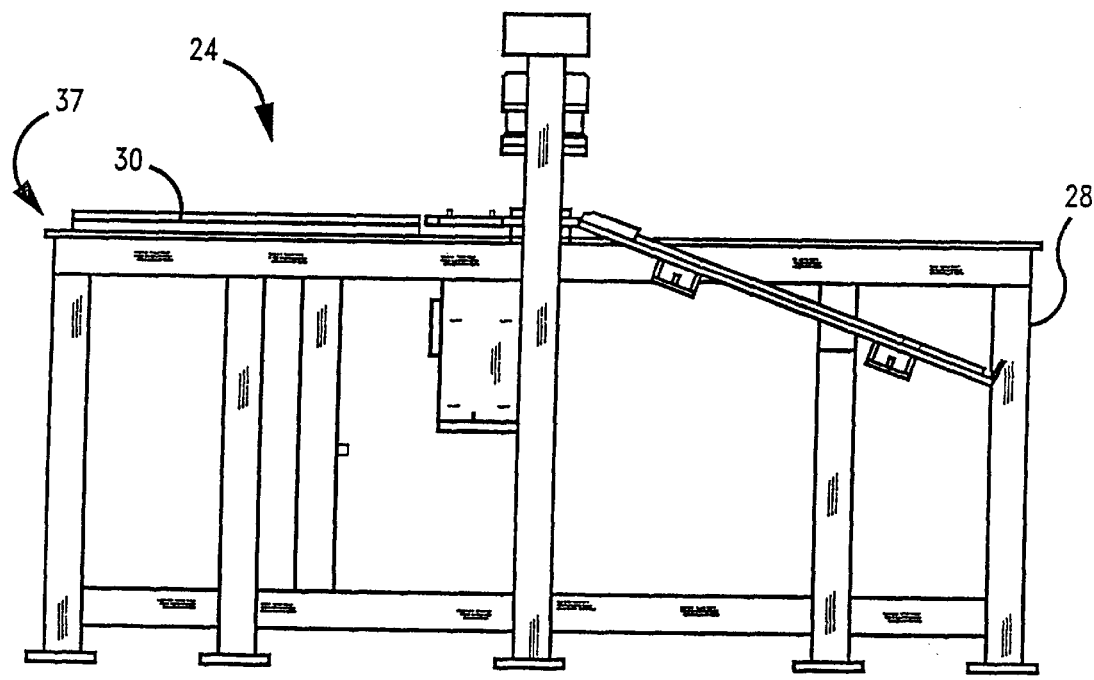
FIG. 5 is a front elevational view of the load/unload subassembly of FIG. 4.
Figure 6:
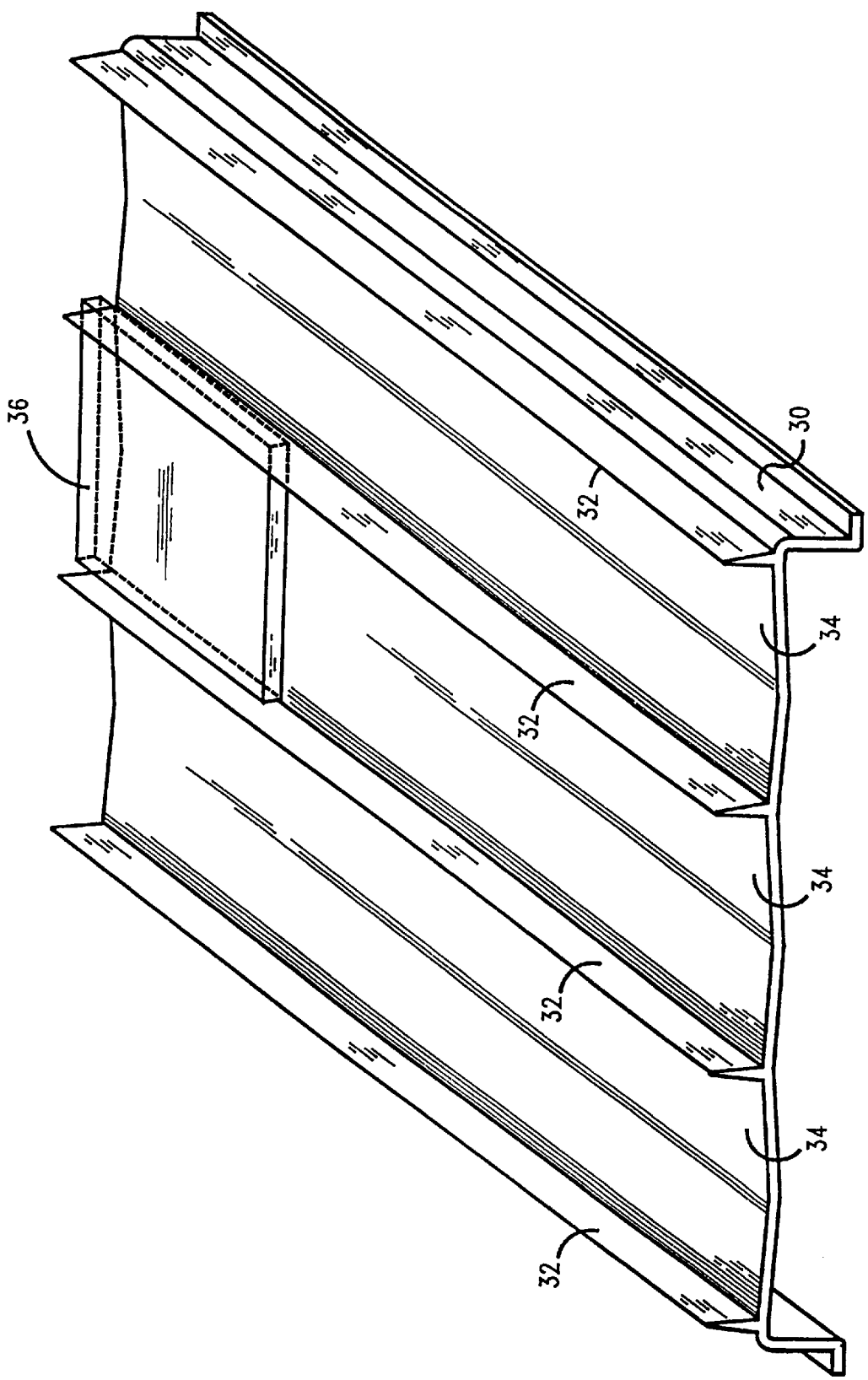
FIG. 6 is a perspective view of the preferred loading tray of the load/unload subassembly of FIG. 4.

In order to load the substrates into the apparatus, a loading/unloading subassembly 24 is employed, as shown in FIGS. 4 and 5. Tray loading of the substrates is performed by a manufacturing operator from previous operation, and the loading tray 30 is secured to the subassembly frame 28 in a horizontal position for loading into the chamfer tooling apparatus. Tray 30 (FIG. 6) may be divided by partitions 32 into separate pathways 34 so that it typically accommodates three rows of twelve substrates 36 each, for a total of 36 substrates, with each substantially planar substrate lying flat on the tray surface. Tray indexer 40 (FIG. 4) is adapted to move the tray laterally to present the different pathways for loading the substrates on all of the rows in the next step.

Part Loading

Figure 7:
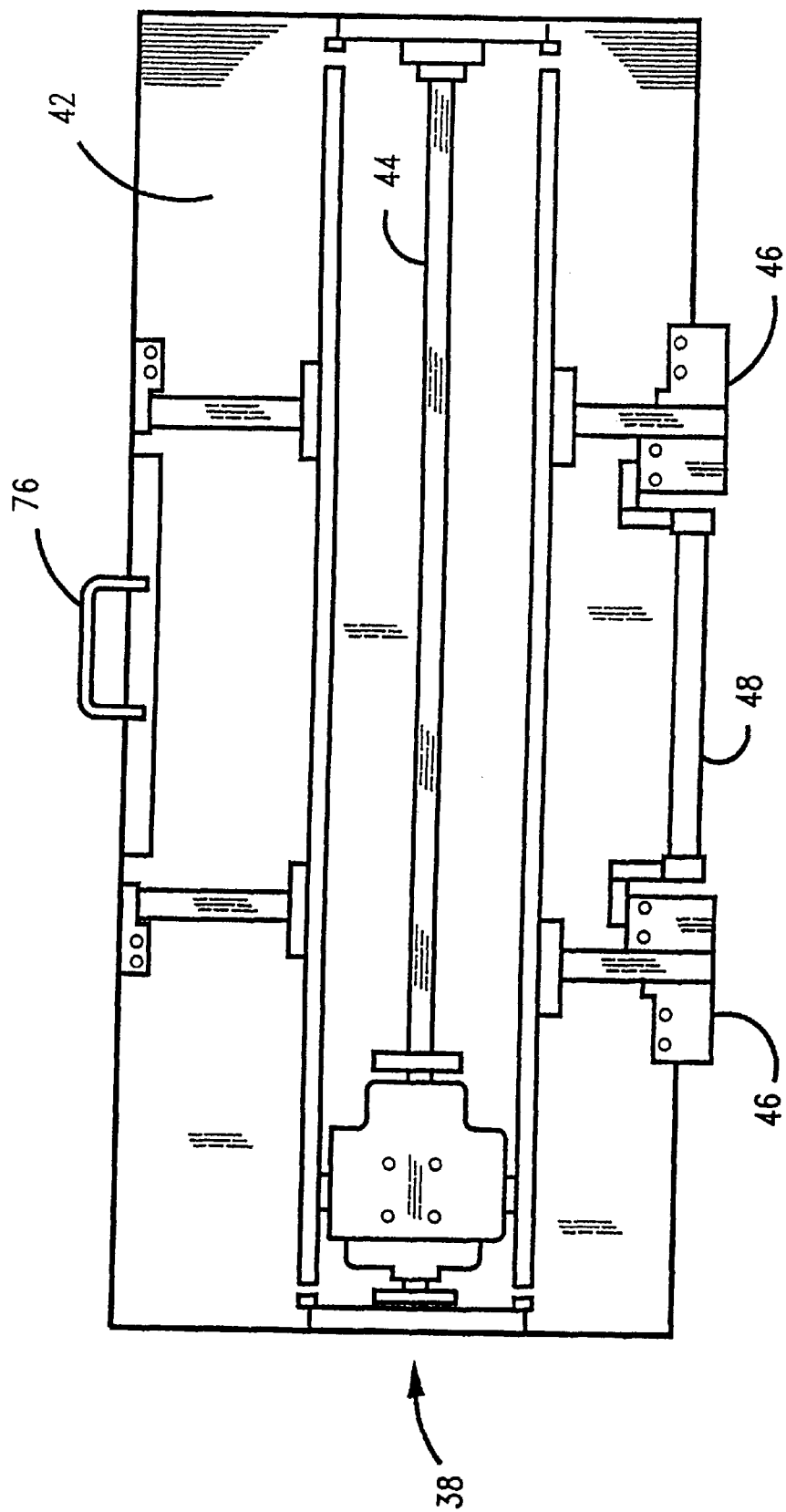
FIG. 7 is a top plan view of a portion of the load/unload subassembly of FIG. 4.
Figure 8:
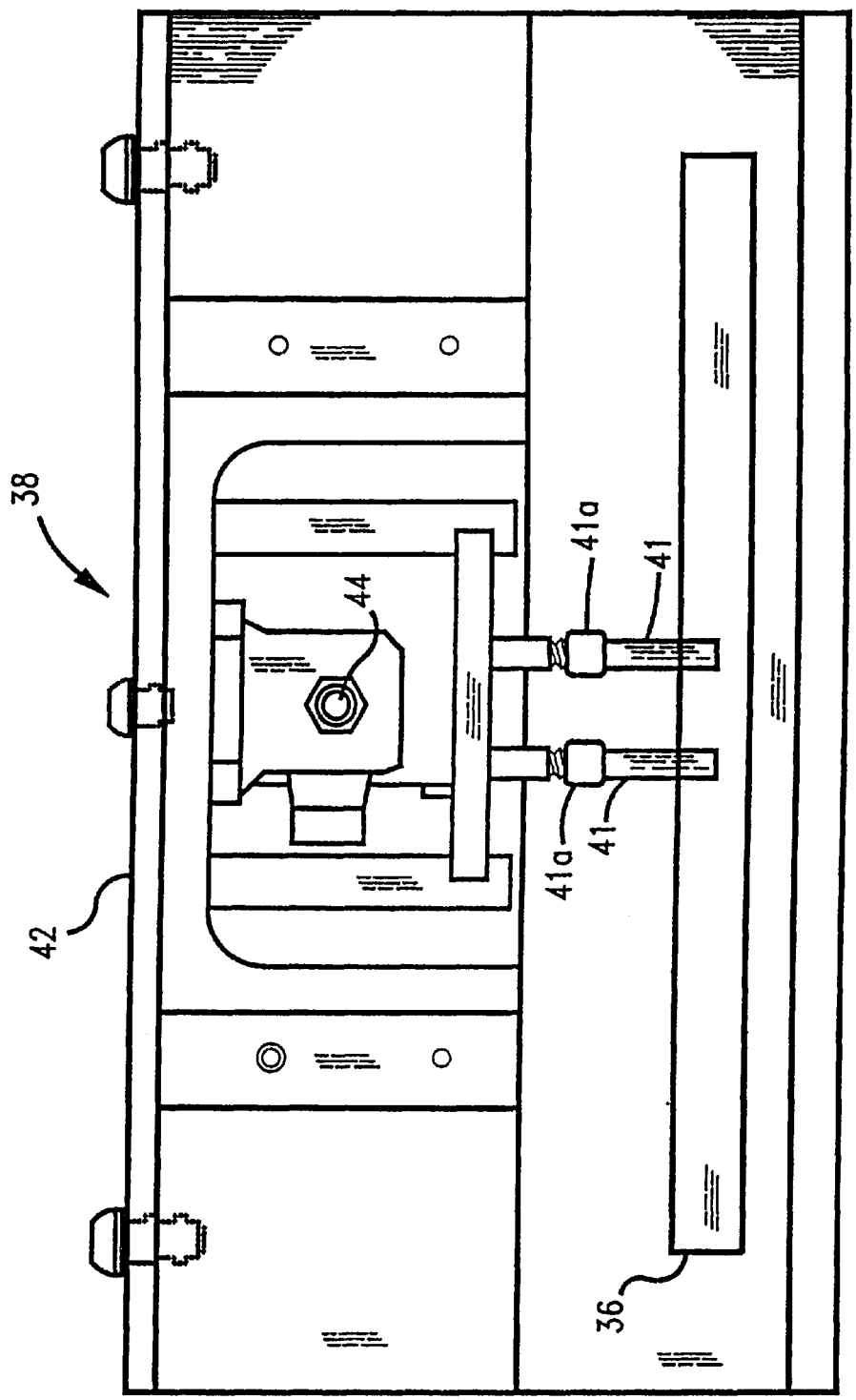
FIG. 8 is an end elevational view of the carriage portion of the load/unload subassembly 4.

From the tray 30, substrate parts 36 are loaded into the chamfer tooling apparatus 20 automatically. FIG. 7 is a top plan view of the preferred loading portion 37 of the chamfer tooling apparatus. A magnetically-coupled carriage 38 serves as the pushing means for autoload station 37 behind the first row of parts for loading the substrates. The carriage employs a rodless cylinder 44 which is relatively long and has a small diameter, as may readily be determined by one skilled in the art, in order to impart a low force to the substrates so that damage to the substrate is avoided. Both the rodless cylinder 44 and carriage 38 are attached to cover 42. The cover is provided with hinges 46 and a counterbalancing spring 48 to permit easy lifting by handle 76 for loading and unloading of trays. Tray indexing mechanism 40 (FIG. 4) indexes the tray and presents the different rows of parts to the pushing mechanism. Attached to carriage 38 are a pair of downwardly extending frangible nylon pins 41 (FIG. 8), each of which has a reduced cross sectional area through its thickness so as to provide a weakened portion 41a above the point of contact with substrate 36. The degree of weakness is such that pins 41 will shear if subjected to a predetermined shear force in the direction of travel of the substrates. If the substrates become blocked from movement, such as by a jam in the loading apparatus, the pins will shear at a force low enough to prevent carriage 38 from excessive movement which would damage the substrates.

Figure 9:
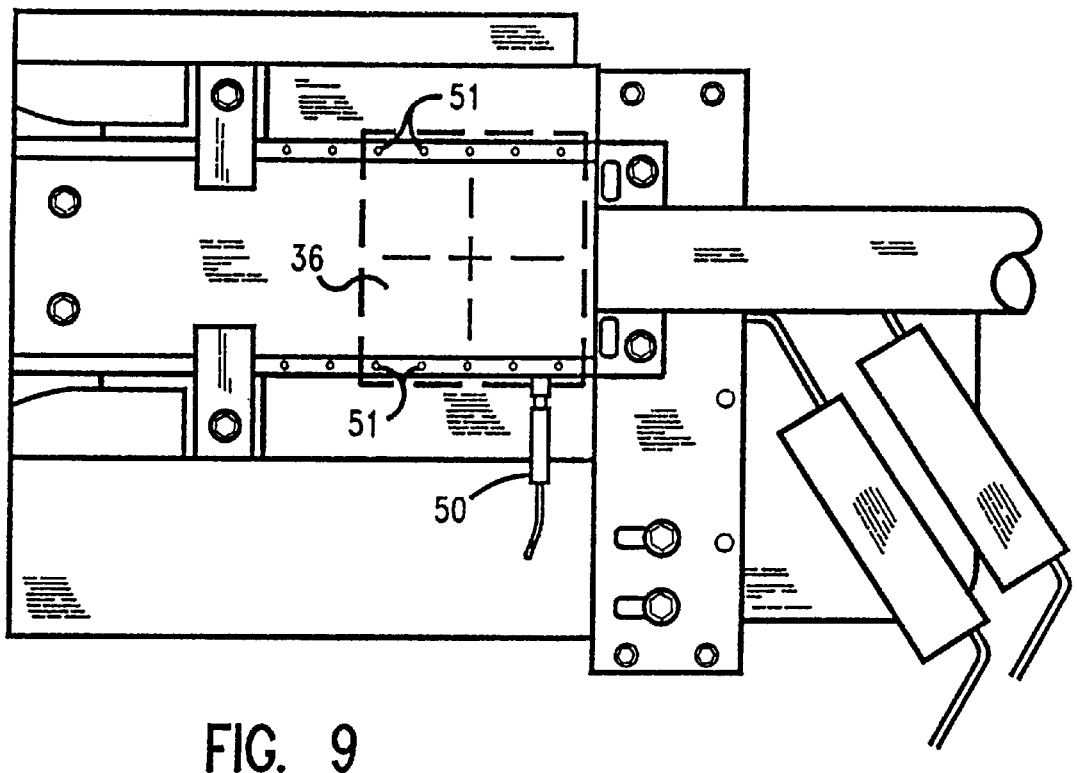
FIG. 9 is a top plan view of a portion of the load/unload subassembly of FIG. 4.
Figure 10:
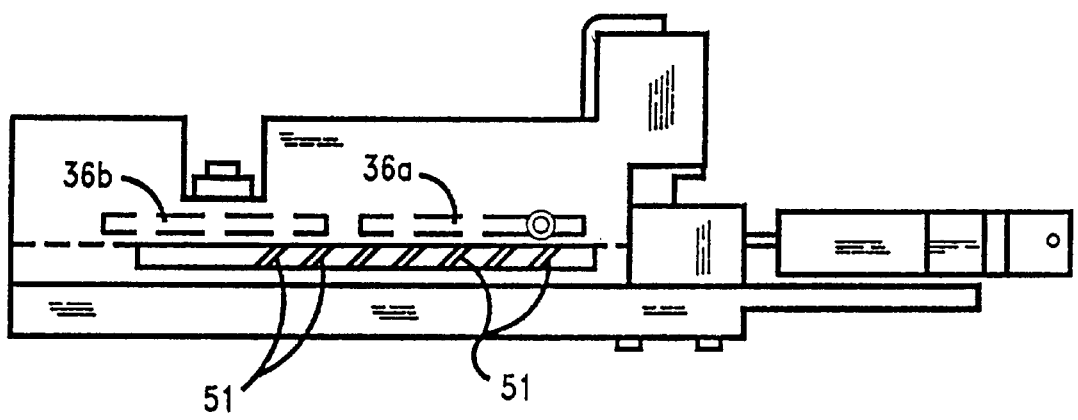
FIG. 10 is a side elevational view of a portion of the load/unload subassembly of FIG. 8.
Figure 11:
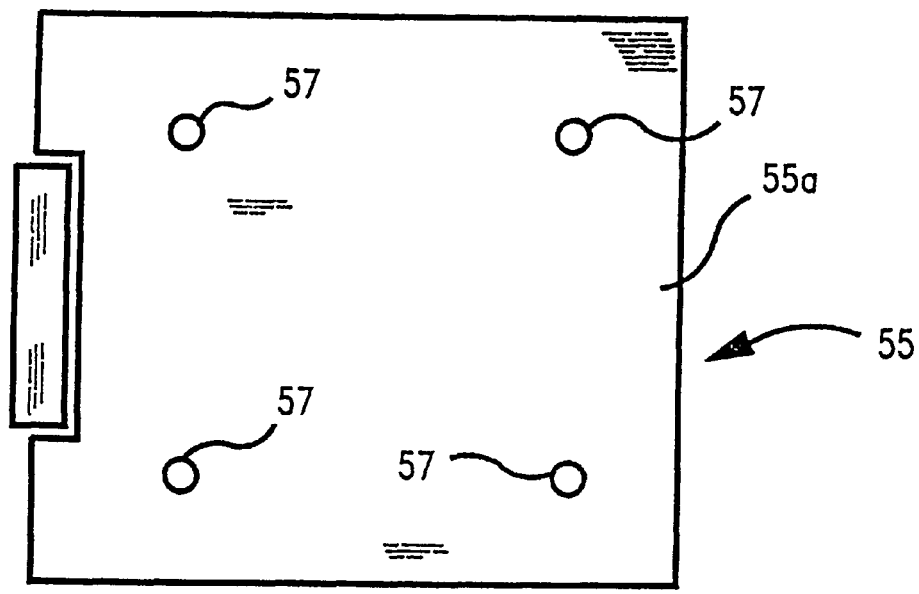
FIG. 11 is a top plan view of a portion of the load/unload subassembly of FIG. 4.
Figure 12:
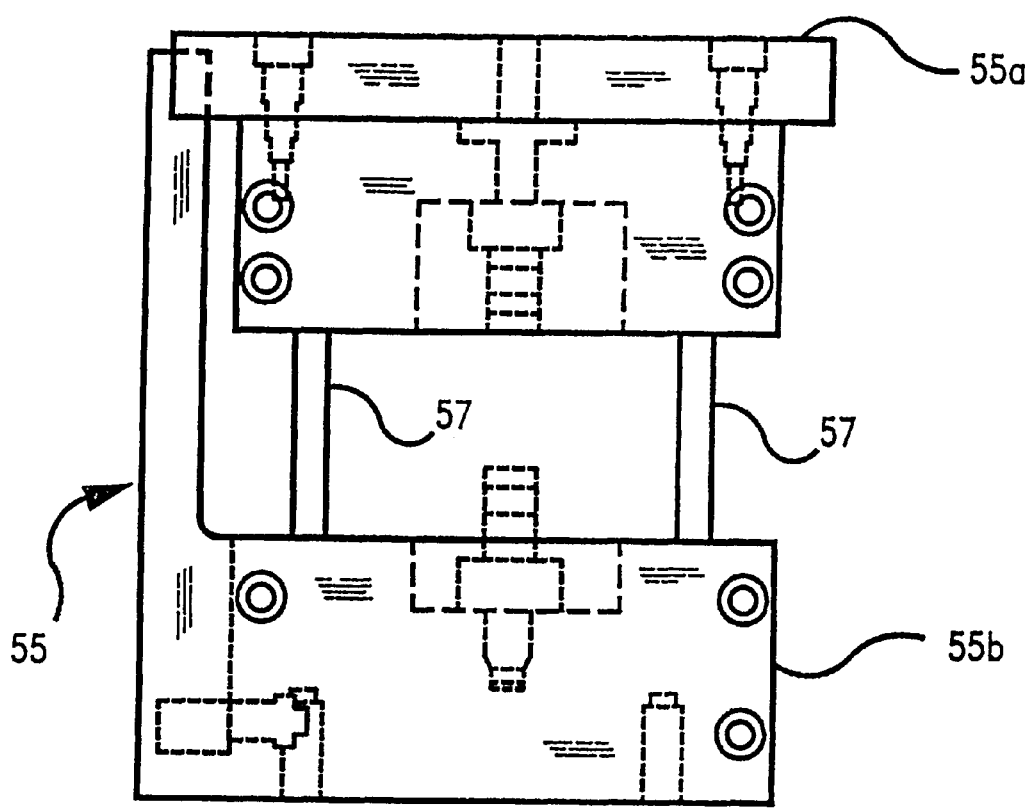
FIG. 12 is a side elevational view of FIG. 11.
Figure 13:
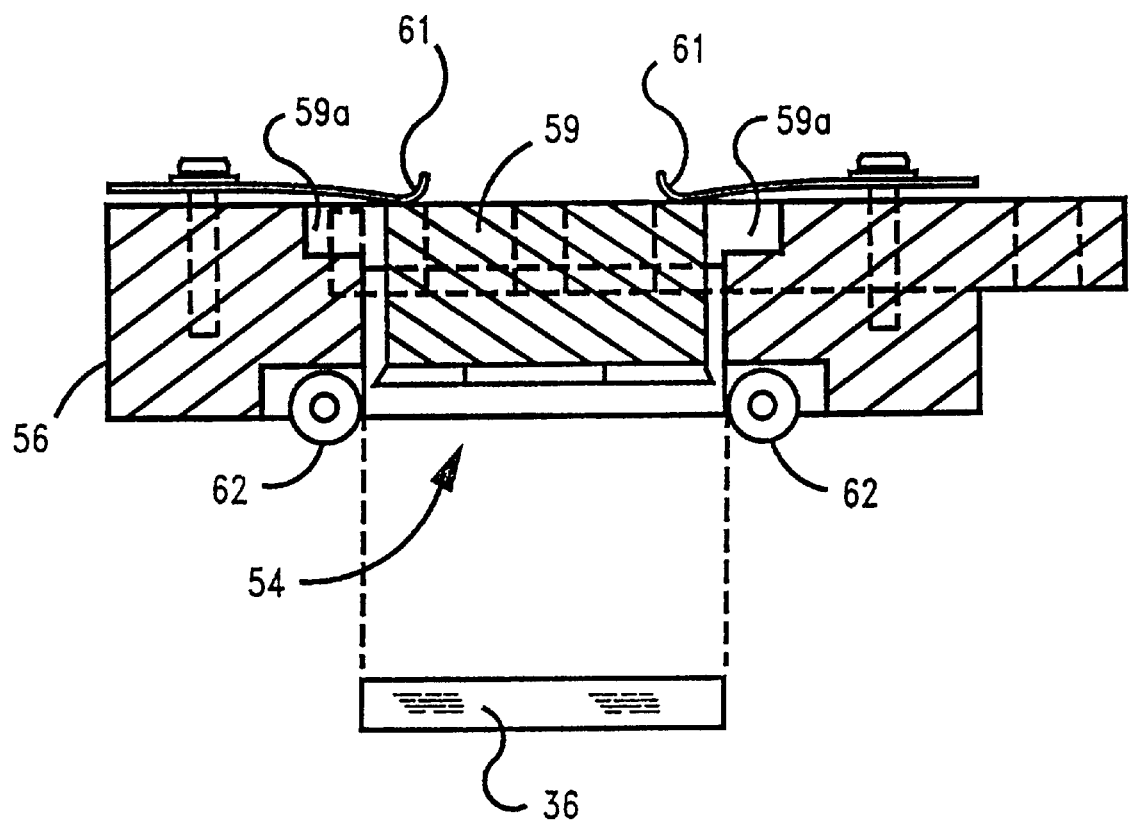
FIG. 13 is a side elevational view of the preferred past-receiving nest portion of the load/unload assembly of FIG. 4.

As shown in FIGS. 9 and 10, and in schematic FIG. 13, the carriage imparts a pushing force to the row of substrates 36 until proximity sensor 50 is activated, thus leaving the lead part just short (preferably about 1 to 2 mm) of its load position. Once this sensor is activated, the pushing action of carriage 38 (FIG. 8) is temporarily stopped. There are provided continuously-operating air jets 51, located under and along the side edge portions of the pathway of the tray track, which are directed at an angle of about 42° to horizontal at the lead substrate 36a. The portion of the track proximate the air jet is preferably made of a low coefficient of friction plastic to facilitate movement of the parts. This flow of air assists in horizontally separating lead substrate 36a from the next substrate part 36b by pushing it and transporting lead substrate 36a through the last few millimeters of travel to the "ready" position. Optionally, there may be provided in place of the air jet a vacuum port 52, connected to a vacuum source (not shown), to separate the lead substrate.

Figure 14:
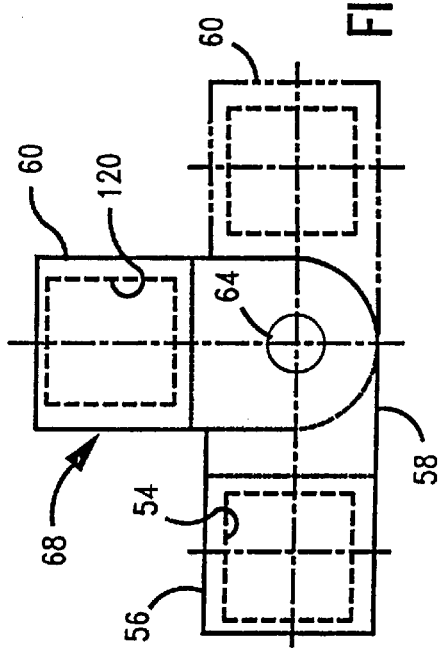
FIG. 14 is a side sectional view of a portion of the preferred loading arm and secured substrate part in the apparatus of FIG. 4.
Figure 15:
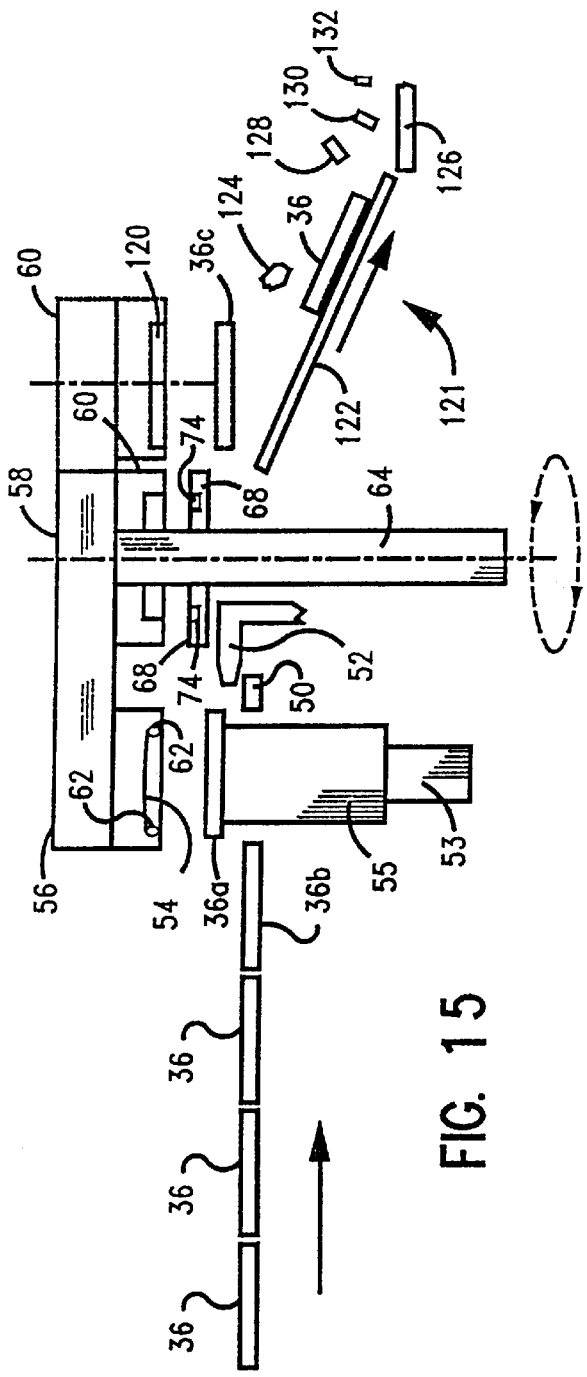
FIG. 15 is a side elevational, partial schematic representation of the preferred loading and unloading subassembly of the apparatus of FIG. 4.

Once in the ready position, out of contact with trailing substrate parts, part carrier or load pedestal 55 secured to an air cylinder 3 thrusts the part 36a upward into the downward facing, centering nest or pocket 54 in loading arm 56 portion of rotary indexing mechanism 58. Carrier 55 (FIGS. 11 and 12) includes a square upper surface 55a on which part 36a rests. Below the surface of carrier 55 are four (4) stiff, vertical steel rods 57, one near each corner, which secure the upper surface to the carrier base 55b. Rods 57 transmit force vertically but are flexible in a direction perpendicular to the plane of upper surface 55a so that the upper surface may move laterally. As shown in FIGS. 13–15, nest 54 includes a resilient, appropriately sized O-ring 62 around its inner periphery to center and removably secure the substrate within the nest, by compression of the O-ring, during the loading operation. In the event that part 36a is misaligned with respect to nest 54, carrier upper surface 55a, as the substrate contacts the walls of the nest, rods 57 (FIGS. 11 and 12) may move laterally in response to properly align the carrier upper surface and part with the nest. Thus, carrier 55 centers itself with respect to nest 54 as the part is loaded into indexing mechanism 54. To prevent shock to the substrate as it is loaded into nest 54, loading arm 56 includes a separate, vertically movable nest core 59 which fits into a correspondingly shaped opening in load arm 56. Four (4) springs 61 located at 90° intervals around the core press down against core flange 59a. Thus, core 59 may move upward if contacted by substrate 36 as it is loaded into nest 54.

After loading a substrate part, carrier 55 and air cylinder 53 then return to their original position, carriage 38 is re-activated, and the cycle is repeated. Rotary indexing mechanism is reversibly rotatable about vertical axis 64 in the directions shown by the arrows to transfer the loaded part to the next operation, as will be described below, after which loading arm 56 returns empty for loading of the next substrate part. Mechanism 58 has an "L" shape in plan view with loading portion 56 on one arm and unloading portion 60 on the other arm.

The aforedescribed process of temporarily stopping parts short of the load position permits substrate parts with a ceramic flash to be separated along the plane of the part from the next substrate part, loaded and processed while avoiding formation of edge chips from excess flashing on the substrate parts. If the flashing on two adjacent parts were to interlock, the flash of the load part would be sheared off upon insertion into the centering nest, thus causing the substrate to have unacceptable edge damage. Also, as shown in FIG. 8a, centering nest 54 has a beveled ledge 55 so that contact of the top surface of the substrate 36a held therein, and hence surface damage to the substrate part, are minimal.

Once a row of substrates has been fully loaded, carriage 38 returns to its original position, tray 30 is indexed laterally by index mechanism 40 to shift an adjacent pathway containing a row of substrates into position for loading, and the process is recommended.

Positioning of Substrate for Process Pedestal/TSM Cleaning Operation

Figure 18:
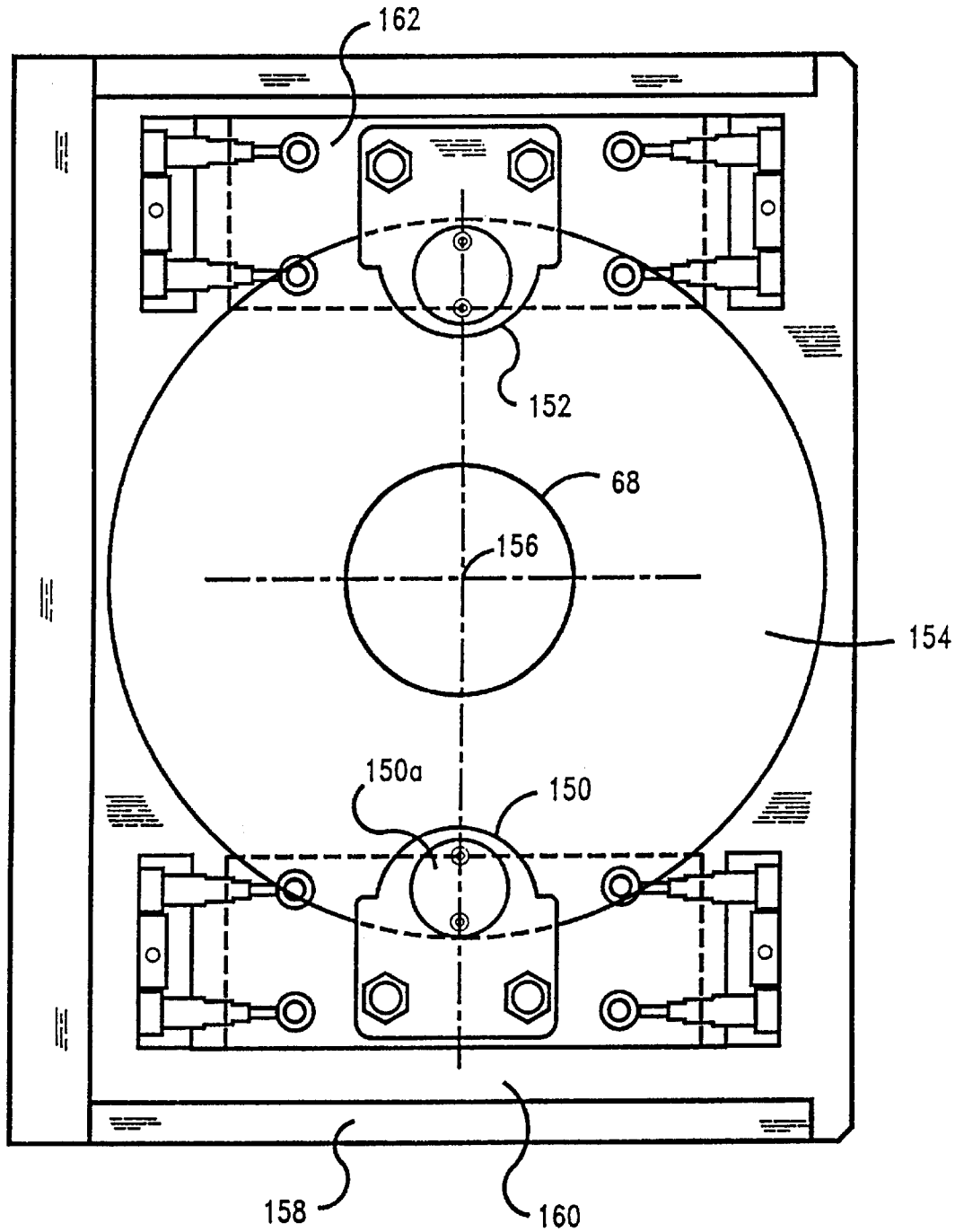
FIG. 18 is a top plan view of the process pedestal and brake assembly of FIG. 17.
Figure 19:
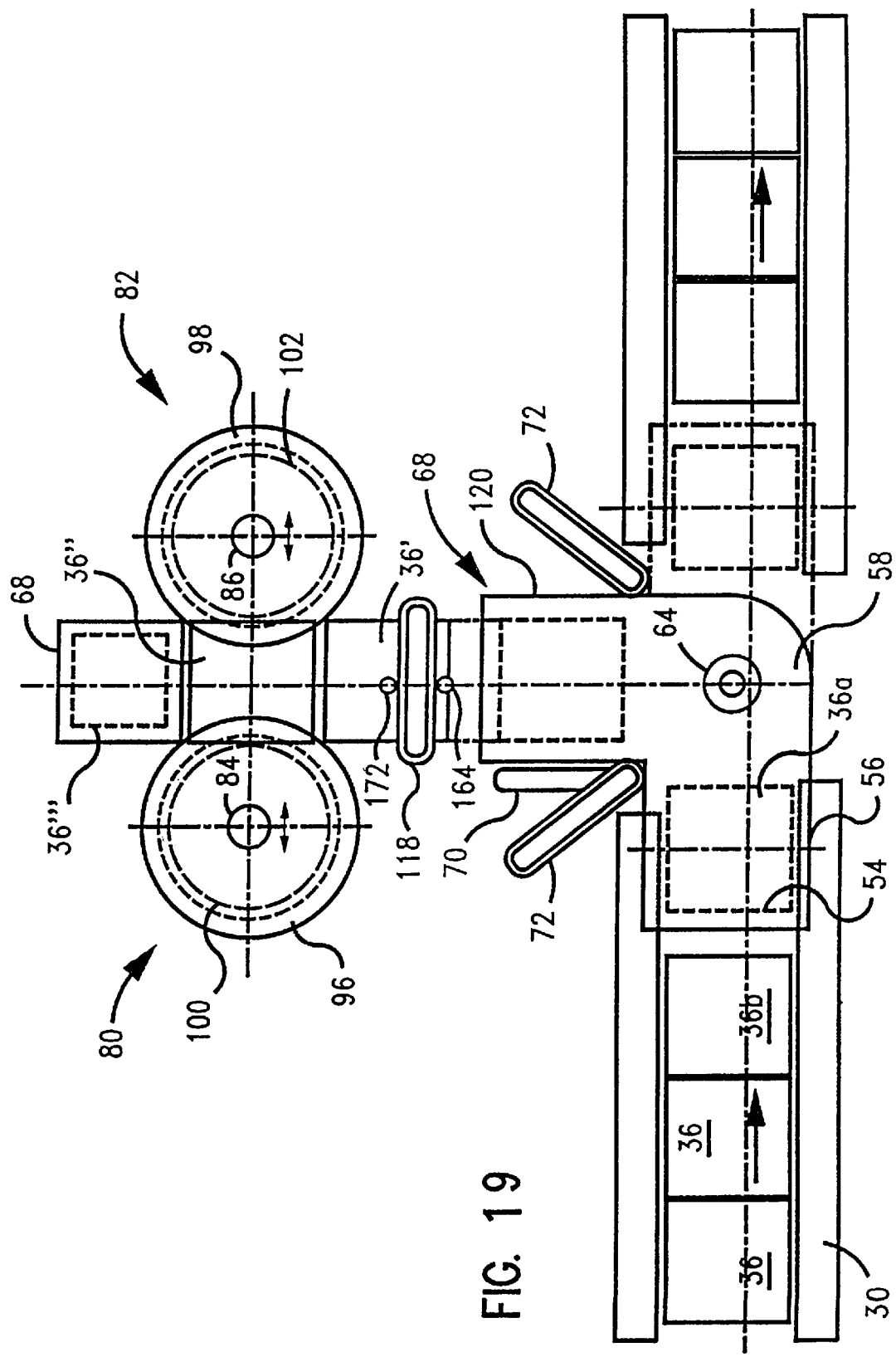
FIG. 19 is a top plan view of a portion of the preferred loading and unloading subassembly of the apparatus of FIG. 4 in conjunction with the preferred chamfering subassembly of the present invention.

In order to unload the substrate part from loading arm 56 of indexing mechanism 58, there is provided pedestal 68 mounted on assembly 69 (FIGS. 2 and 3) for receiving and carrying the substrate part (FIGS. 15, 17, 18). After any debris present is blown off of the surface of process pedestal 68 by nozzle 70 connected to a source of pressurized gas (not shown), the substrate part held within O-ring centering nest 54 is rotated 90 degrees from the loading position by load/unload arm 56 on rotary indexing mechanism 58 and placed onto process pedestal 68 mounted on a vertically oriented air cylinder (not shown), where it is transferred via vacuum generated from ports 74 in the surface of pedestal 68 attached to a source of vacuum (not shown). Pedestal 68 has a width less than that of the substrate to be processed such that the peripheral edges of the substrate extends horizontally beyond the periphery of the pedestal in order to effect the subsequent chamfering operations. Pedestal 68 is also adapted for rotation around an axis normal to the plane of the substrate and also in the direction normal to the plane of the substrate for subsequent processing of the substrate, as will be discussed further below.

During rotation of loading arm 56 from the load position to the unload position (shown in phantom lines in FIG. 16), the lower surface of the substrate part passes through an upwardly directed top surface metallurgy (TSM) brush cleaning station 72 for removal of any debris. The substrate part is held onto the surface of pedestal 68 by vacuum during subsequent chamfering operations, until loading onto the unloading arm portion 60 of rotary indexing mechanism 58.

Process pedestal 48 utilizes a servo-motor produced by Dynaserv Co. to rotate the substrate during processing, as will be further described below. Although the servo-motor acts to prevent undesired rotation and can compensate for such rotation by returning the part to its desired position, such compensation can occur too late, after the part has been machined in the wrong position. This may occur if the part is subject to strong forces during machining, as can happen in the chamfering operations described below. To reduce and prevent the part from rotating or moving out of position, there is provided a braking system which acts to prevent undesired rotation and movement of the part during machining. The preferred brake system for process pedestal 68 is depicted in FIGS. 17 and 18 in which brake calipers 150, 152 are disposed on diametrically opposite sides of brake disc 154. Each caliper includes a pair of pads (150*a*, 150*b*) which apply pressure to stop rotation of disc 154 when activated by a source of air or hydraulic power (not shown). Disc 154 is secured to pedestal 68 in a plane normal to the axis of rotation of the pedestal 156 and rotates with the pedestal. Calipers are secured to stationary frame 158 (which is secured to frame 22 of the chamfering apparatus) by strips 160, 162, which are preferably made of 0.040 (1 mm) spring steel attached to frame 158 by fasteners. Strips 160, 162 securely hold calipers from movement in the plane of the disc, but are flexible so as to permit movement in the direction of axis 156. The flexure strips permit up and down movement of calipers 150, 152, so that during rotation of pedestal 68, they may "float" in response to any warping or other irregularities in disc. In operation, when the pedestal is rotated to the desired position, the calipers are activated to grip the disc, and an electronic component substrate or other part mounted on process pedestal 68 may be secured from movement during processing.

Edge Chamfering I

In order to provide a properly cut edge to the part, the substrate is moved horizontally, in the plane of the substrate, between a pair of spaced, identical spindles 80, 82 rotatable on vertical axes 84, 86, respectively, which may be adjusted vertically by handles 77 (FIGS. 1–3). The spindles are mounted on sliding ways 77, 78 for adjustment in the X direction toward and away from each other. Spindles 80, 82 are powered by spindle motors 81 (FIG. 1) and controlled by spindle motor controller 83 (FIG. 3). FIG. 20*a* depicts the appearance of substrate 36 at the start of the process, before any chamfer is cut, wherein the substrate has four squared-off peripheral edges at about 90 degrees to the plane of the part. Each substrate part passes between the spindles such that the top and bottom edges of two opposite sides of the part (a total of four edges) are cut during an edge chamfering process wherein the substrate part proceeds from position 36' prior to cutting to position '' during cutting and finally position 36''' after cutting (process pedestal assembly position 69', FIG. 3). FIG. 20*b* depicts the appearance of substrate 36 after the first chamfer pass in the process, wherein opposite peripheral sides of the substrate have beveled corners 90 cut into the top and bottom of the edges.

Figure 21:
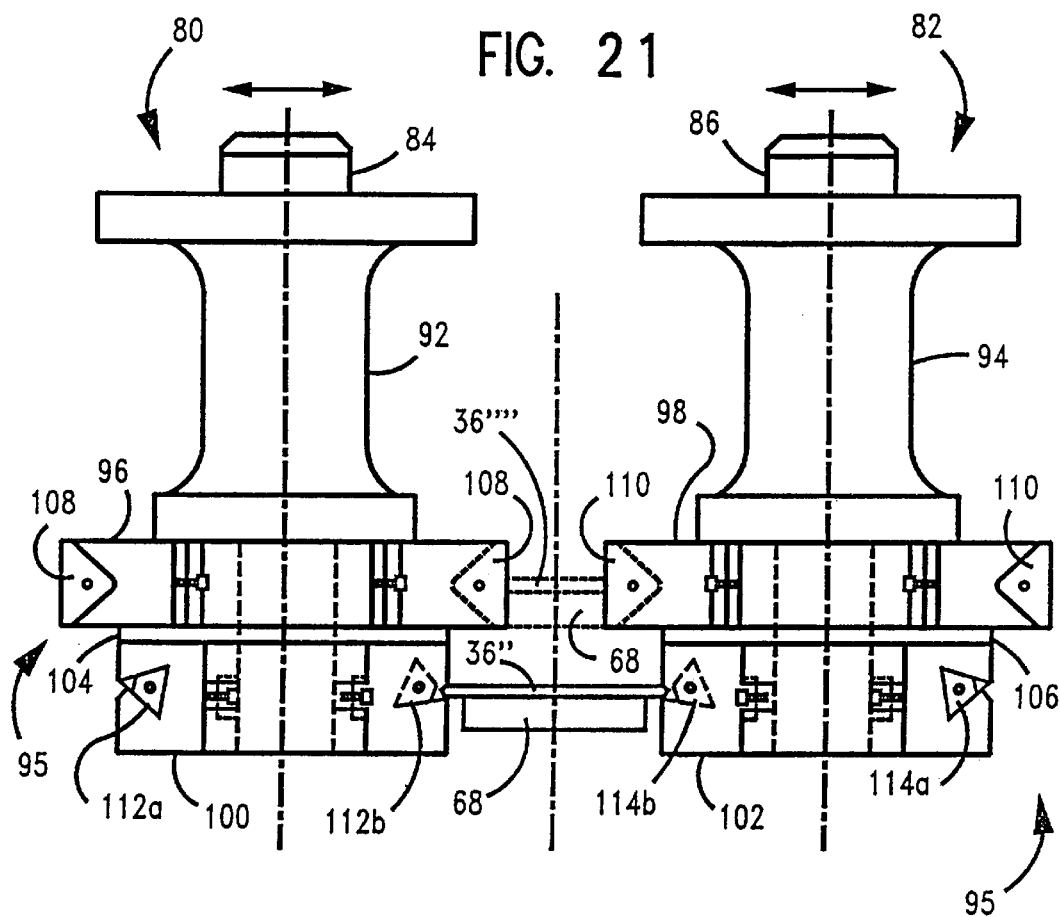
FIG. 21 is a side elevational view of the preferred cutting spindles employed in the automated chamfer tooling apparatus of FIG. 1.
Figure 22:
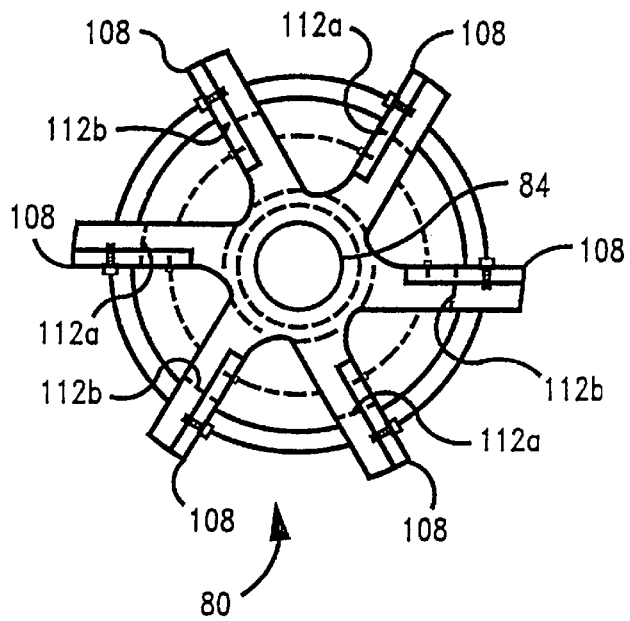
FIG. 22 is a top plan view of one of the cutting spindles depicted in FIG. 21.

The cutter assembly 95 employed in spindles 80, 82 is depicted in FIGS. 21 and 22. The cutters are disposed below arbors 92, 94 and include corner chamfering cutters 96, 98 and edge chamfering cutters 100, 102, separated by spacers 104, 106, respectively. Only two arbors and spindle assemblies of the present invention are required to cut all of the necessary chamfers in the substrate parts, for a total of twelve chamfered edges and corners. The spindles are movable on the frame of the assembly for adjustment toward and away from each other, depending on the size of the substrate to be processed and the particular chamfering operation being performed. Mounted around the periphery of the corner and edge chamfering cutters are a plurality of cutting inserts 108, 110 on corner chamfering cutters 96, 98, respectively, and cutting inserts 112*a, b* and 114*a, b* on edge chamfering cutters 100, 102, respectively. Inserts 108, 110, 112 and 114 are made of any well known material suitable for edge and corner chamfering of the substrate parts.

As shown in FIG. 21, substrate 36 passes between edge chamfering cutters 110 and 102 as cutting inserts 112*b* and 114*a* chamfer the one edge of opposite sides of the substrate. While using individual, well known, standard-type cutting inserts in the spindle assemblies shown, the inserts themselves are configured in such a way as to balance the arbor and also cut both top and bottom edges of the substrate part simultaneously. Spindle 80 has six radially extending arms (FIG. 22) which form each of corner chamfer cutter 96 and edge chamfer cutter 100 and on which are mounted the cutting inserts. On the edge chamfer cutter 100, the cutting inserts are mounted so than on opposite arms, one insert 112*a* is configured and disposed to chamfer the top edge of part 36 while insert 112*b*, mounted radially opposite insert 112*a*, is configured and disposed to chamfer the bottom edge of part 36 (seen in side view in FIG. 21). The inserts 112*a* and 112*b* are alternately staggered around the six arms as shown in FIG. 22. Likewise, on spindle 82, inserts 114*a* and 114*b* are staggered around radially extending arms of edge chamfer cutter 102 to chamfer the top and bottom edges, respectively, of the substrate part. Since the top and bottom edge cutting inserts are mounted on the same spindle, cutting of both chamfers on each opposite edge occurs simultaneously as the part passes between the spindles. There are six edge inserts per arbor, three of which cut the top surface and three of which cut the bottom surface. These sets can be rotated twice to new configurations for insert life maximization. After occupying three distinct positions, the insert sets can be flipped so that new cutting surfaces are obtained. They can again be rotated twice to new positions. Thus, each insert 112*a*, 112*b*, 114*a*, 114*b* can occupy six positions to maximize its life.

Index 90 Degrees

After the initial edge chamfering pass from position 36' to 36''' (FIG. 19), process pedestal 68, with the substrate still secured by vacuum, is indexed 90 degrees by rotation about an axis normal to the plane of the substrate part. This then moves the unchamfered edges 88 (FIG. 20*b*) into position parallel to the direction of travel of the process pedestal and presents them in the proper orientation to be chamfered by the cutting inserts on spindles 80, 82.

Edge Chamfering II

The substrate is again moved between the sets of edge cutters on spindles 80, 82, from position 36''' to position 36' such that the remaining four edges are cut during this step in the same manner described previously in the Edge Chamfering I step. As shown in FIG. 20c, all four peripheral sides of substrate part 36 have beveled corners 90 cut into the top and bottom of the edges.

Lift Substrate, Corner Chamfer I

Figure 23:
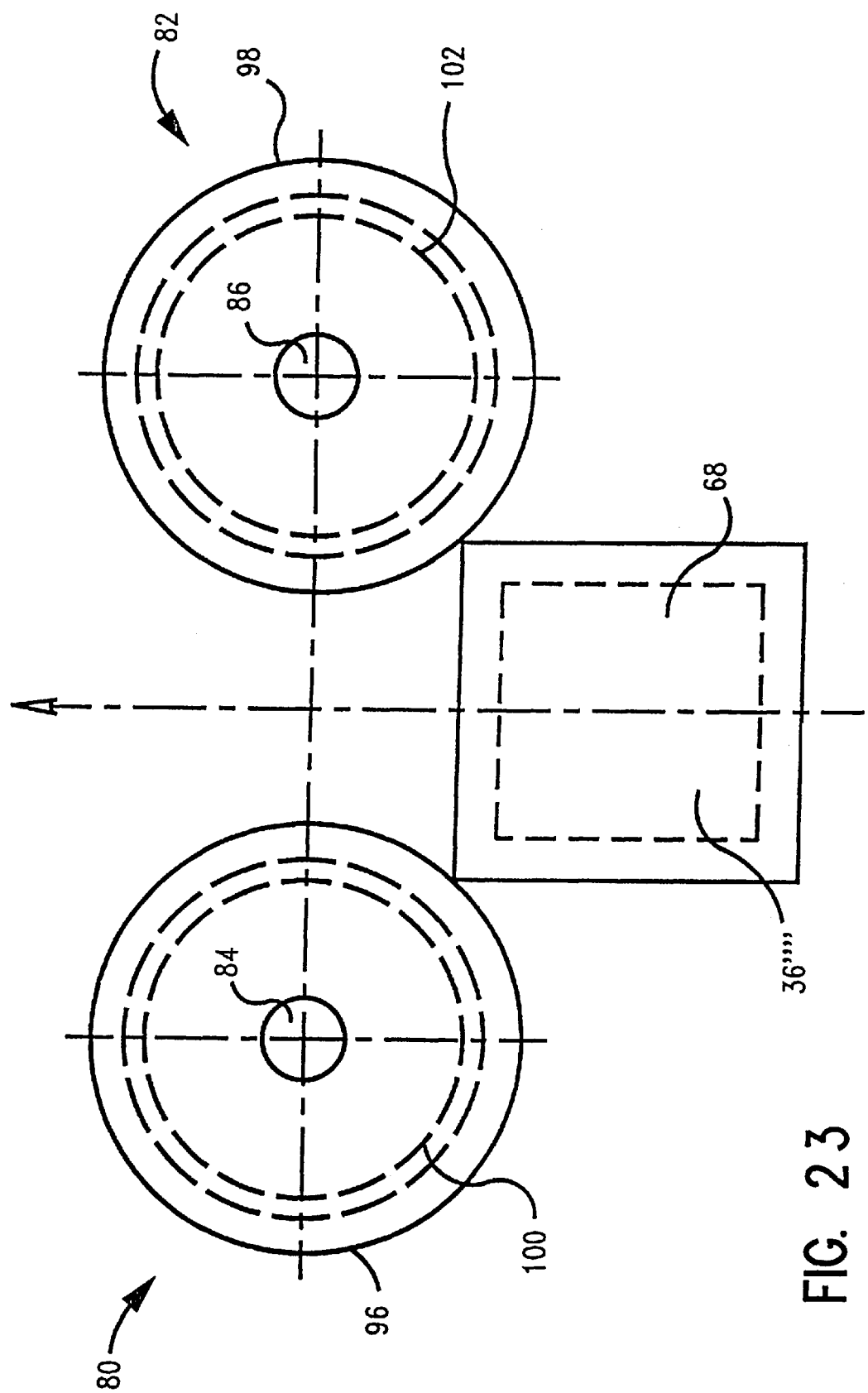
FIG. 23 is a top plan view of a portion of the chamfering subassembly depicted in FIG. 10 showing a corner chamfering operation.
Figure 24:
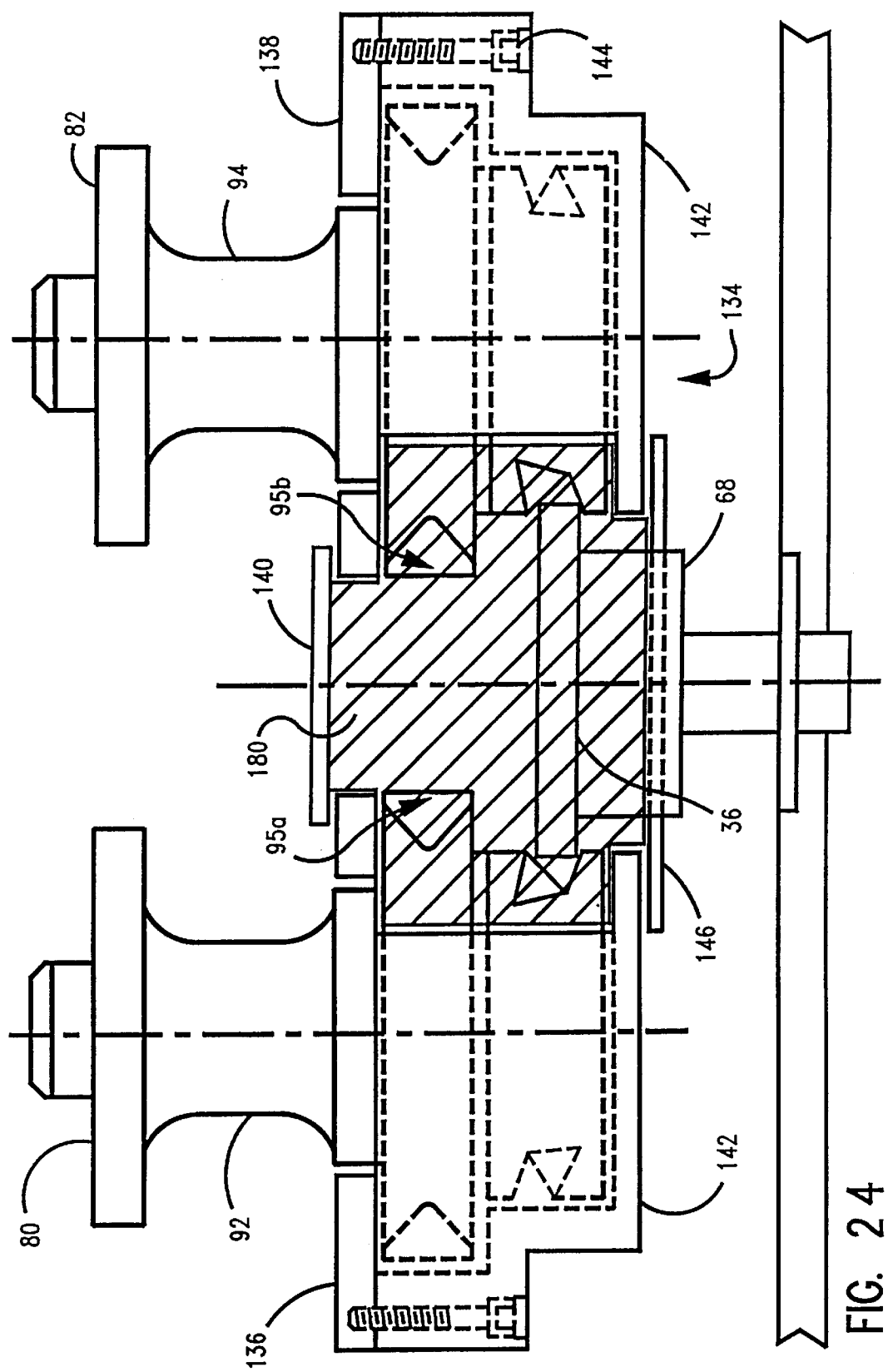
FIG. 24 is a side elevational view of the cutting spindles depicted in FIG. 21 showing the preferred particle collection enclosure of the present invention.
Figure 25:
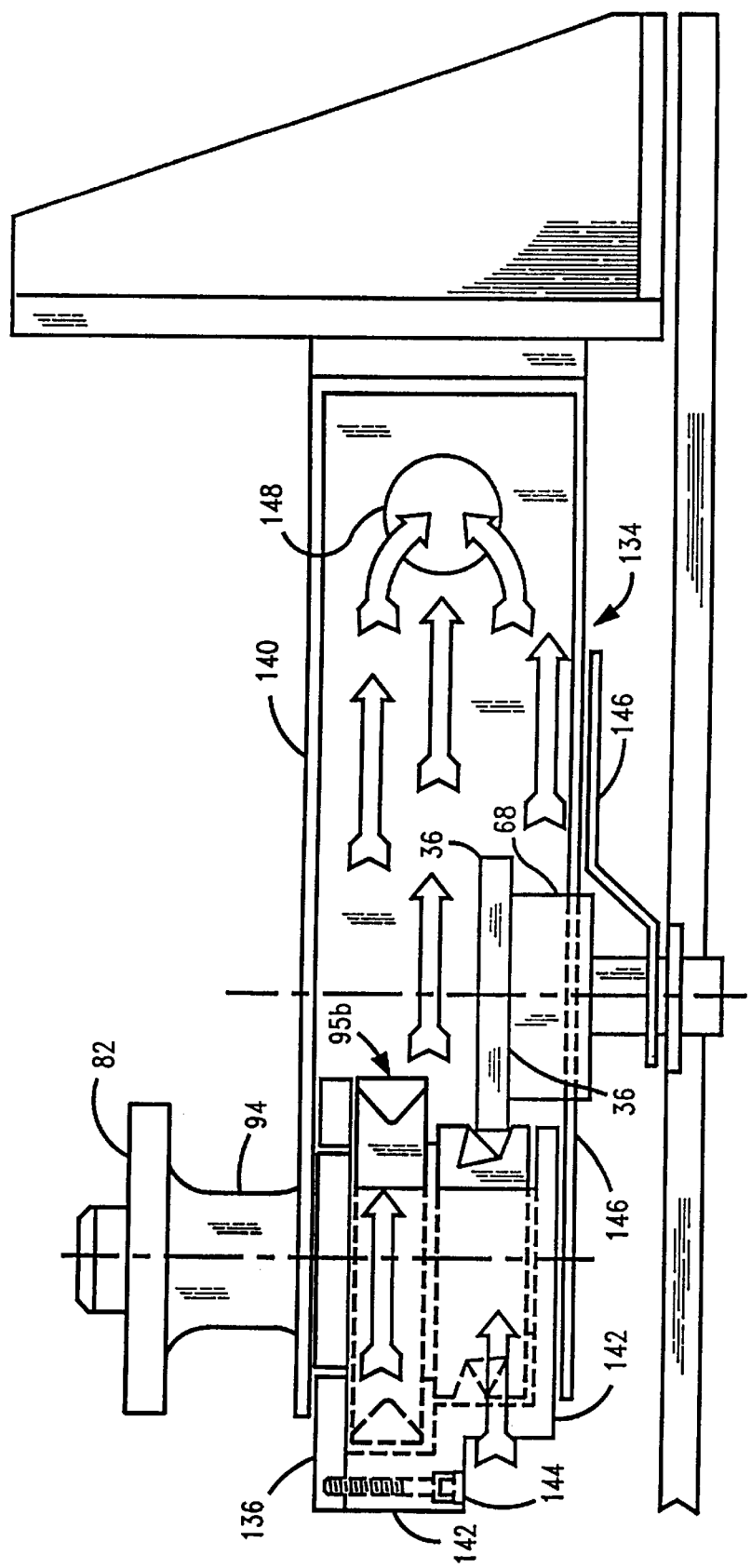
FIG. 25 is an end elevational view of the particle collection enclosure depicted in FIG. 24.

In order to present the substrate for corner chamfering by corner chamfer cutters 96, 98 the substrate must be lifted upward so that it is in the plane of the corner cutters. Process pedestal 68, with substrate 36 still secured, is accordingly adapted to move upward from the position in which the edges were chamfered to position 36"" of the substrate (FIGS. 21 and 14) for cutting of two of the four corners. As shown in FIG. 23, pedestal 68 and the substrate then move linearly along the same path used in edge chamfering to position 36"" where two adjacent corners are chamfered as the part is brought into simultaneous contact with cutting inserts 108 of edge chamfer cutter 96 and inserts 110 of edge chamfer cutter 98. The resultant substrate appearance is as shown in FIG. 20d wherein substrate 36 has corner chamfers 116 on two adjacent corners, the remaining two corners being unchamfered.

Cutters 96, 98 are adapted to move independently to the appropriate position so that a particular corner obtains its precise chamfer configuration and size. Thus, after completion of edges and repositioning of the part, the same spindles are used to cut the corner chamfers. Because of the design, inserts wear in different spots along their cutting edges and therefore can be used several times before resharpening (via rotation). Since there are multiple corner cutting inserts per cutter, the individual inserts can be moved to different locations. Preferably, there are six corner cutting inserts per arbor, as shown in FIG. 22. These inserts can be rotated five times to different locations to maximize insert life. Also, after these locations are exhausted, an insert set can be flipped and switched to the other cutter to further maximizing life. Thus, each corner insert can occupy a maximum of 12 distinct positions. By utilizing standard-type inserts for both the edge and corner cutting inserts, worn components are easily replaced, which minimizes downtime.

Index 180 Degrees, Corner Chamfer II

After completion of the corner chamfering I step, process pedestal 68, with vacuum-chucked substrate 36, is moved linearly back away from cutters 96, 98 and then indexed 180 degrees by rotation around the axis normal to the plane of the substrate. Then, presenting the remaining unchamfered corners toward spindles 80, 82, the above-described corner chamfer process is repeated thus truncating the remaining two corners. The resultant substrate appearance is as shown in FIG. 20e wherein substrate 36 has corner chamfers 116 on all four corners, as well as edge chamfers 90 on the top and bottom of all four edges.

Through Cleaning Station

Following completion of all of the chamfering steps, the substrate is moved through bottom surface metallurgy (BSM) cleaning station 118 (FIG. 19) such that vacuum brushes glide over the top surface of the substrate part, thus removing any loose, lightly-adhered debris. Further, for parts which have a cavity, station 118 includes air blowout nozzles 164, 172 which remove loose cavity particles. FIGS. 26a,b and 27a,b show the nozzles used in BSM station 118. First nozzle 164 is made by drilling a 0.18 in. (4.5 mm) diameter hole 166 through a threaded fastener and cutting a 0.350 in. (8.9 mm) by 0.030 in. (0.76 mm) exit slot 168 at the opposite head 170. Second nozzle 172 is made from hollow 0.25 in (6.35 mm) copper tubing 174 which has a 0.18 in. (4.5 mm) inner diameter, one end 176 of which has been flattened to have a 0.26 in. (6.6 mm) by 0.020–0.025 in. (0.50–0.64 mm) exit slot.

Lower Substrate

Pedestal 68 and attached substrate 36 are moved downward in a direction normal to the plane of the substrate and returned to their original height at the start of the chamfering process after passing through cleaning station 118.

Removal From Process Pedestal

In order to remove the substrate from the process pedestal, an air cylinder lifts substrate 36 and thrusts it into downward facing, centering nest 120 in the unloading arm 60 portion of rotary indexing mechanism 58. The vacuum holding the substrate to pedestal 68 is released, and the substrate part is transferred into nest 120, which includes an appropriately shaped vacuum chuck.

Rotation

Once the part is secured in unloading nest 120, rotary indexing mechanism 58 is rotated 90 degrees, and the part is released. This 90 degree rotation occurs at the same time as rotation of rotary indexing mechanism 58 during loading of the part from the tray to the process pedestal such that as arm 56 loads an unfinished substrate arm 60 simultaneously unloads a finished substrate. During rotation of unloading arm 60, the lower surface of the substrate part passes through an upwardly directed top surface metallurgy (TSM) brush cleaning station 72 for removal of any debris.

Automatic Unloading

As shown in phantom lines in FIG. 15, substrate part 36c is released at an automatic unloading station 121 by turning off the vacuum of nest 120 and applying compressed air to push the part onto air track 122 which is oriented at approximately a 20 degree angle from horizontal for gravity-assisted travel. Track 122 contains angled air ports 124 connected to a source of pressurized air (not shown) which assist in allowing the substrate to travel into unloading tray 126, which, like loading tray 30, preferably has multiple pathways separated by partitions for accommodating multiple rows of chamfered substrate parts. The indexing of unloading tray 126 is similar to that of loading tray 30. Once a row or pathway in the unloading tray has been filled, this tray moves laterally and indexes to the next position to fill the next row.

The unloading subassembly of the present invention includes various optical sensors 128, 130 and 132 for determining if a part is present. Proximity sensor 128 prevents parts from piling up on one another on the air track. Proximity sensor 130 serves to prevent indexing the tray when a part is situated partly on the air track and partly within the tray and is located adjacent the air track/tray interface. If sensor 130 is activated, tray indexing will not take place. Sensor 132 serves to sense that a particular row of tray 124 is full. If sensor 132 is activated, tray 124 indexes to the next row.

Adjustments

The preferred automated chamfer tooling apparatus of the present invention may include multiple manual and controller adjustment possibilities such that a high process capability and tight process parameters may be maintained.

Spindles 80, 82 are each adapted to be adjusted in both the X direction (toward and away from each other) along sliding ways 78, 79 and the Z-direction (up and down in a direction normal to the plane of the substrate parts) by adjustment of handle 79. In particular, the X-dimension adjustment permits control of the edge chamfer average imparted by the respective spindles and the Z-dimension adjustment permits control of the top/bottom ratio of edge chamfers on the respective spindles.

The apparatus also may include a centering adjustment feature which facilitates control of chamfer variation from edge to edge. For instance, if there is a large disparity between bottom edges on a spindle, the centering function would be adjusted appropriately. Also, there may be included a rotational adjustment, which can be manipulated to optimize the orthogonal placement of the substrates.

Further, the tool is programmed such that each of the individual corners can be fine-tuned to a chosen nominal dimension. This is accomplished by moving the spindles an appropriate amount during corner chamfer steps. Beyond normal adjustments for incoming product variability, different insert wear, and other variables, this feature is applicable to products which have specific corner dimensional requirements. For instance, many products have an orientation requirement, in which one corner is distinctly larger than the other corners.

The apparatus of the present invention is believed to be unique in that it integrates several process steps into one short cycle. These steps include: automatic loading of substrates, chamfering of eight edges, truncation of four corners, cleaning of parts, and unloading of parts. The configuration of the present invention permits for the use of only two arbors to cut all twelve chamfers in a very short cycle time. Also, since there are multiple inserts and insert locations, insert life is maximized via rotation and flipping. The standard-type inserts are easy to replace, thus tool downtime is minimized.

Incorporated into the tool are a number of cleaning stations which integrate a combination of contact brushes and vacuum removal devices. Throughout the process, these cleaning stations maintain the cleanliness of both the part and tooling surfaces that will contact the parts. Process data demonstrates that the apparatus of the present invention does not add any significant contamination, and can actually remove some contamination that may travel with the substrate from prior operations. The present invention eliminates the need to resort to application of protective tape onto substrates prior to edge chamfering to maintain the cleanliness throughout the process.

Chip Collector

Figure 16:
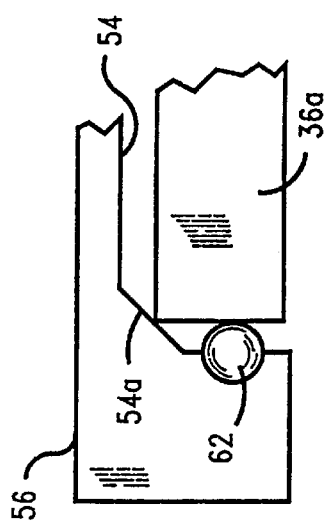
FIG. 16 is top plan view of the preferred substrate indexing mechanism utilized in the load/unload subassembly of FIG. 4.

The arbor housings employed in the present invention have been specially designed to collect the chips or waste particles generated during cutting. By closely matching the configuration of the housing to the shape of the arbor, the system actually acts as a fan, propelling the particles removed towards the collection point and keeping them from falling onto the substrate. In particular, as shown in FIGS. 15 and 16, the cutter assembly portions 95a and 95b of spindles 80, 82 are substantially surrounded by enclosure 134 which is made of sheet metal or plastic. Enclosure 134 is comprised of several sections—1) carrier plates 136, 138 which cover the top of cutter assemblies 95a and b, 2) top enclosure plate 140 which is secured to the cover plates and extends rearward from the cover plates away from the cutter assemblies, 3) cutter cover 142 which is secured to the top enclosure plate and to the carrier plates by fasteners 144 and which surrounds the side and bottom portion of the cutter assemblies and process pedestal 68 travel area rearward, except for a slot in the bottom to permit travel of the pedestal, and 4) bottom enclosure plate 146 which moves with the process pedestal and closes the slot in the bottom of cover 142 as the pedestal 142 moves toward the cutter assemblies. The front portion of the enclosure, adjacent the cutter assembly portions, is open for intake of air, as indicated by shaded portion 180 in FIG. 24.

At the rear portion of enclosure 134 are a pair of vacuum collection inlets 148, located on opposite sides of the enclosure, connected to a source of vacuum (not shown), for collecting the waste particles generated during machining of the substrates. The front portion of the enclosure is configured to match the shape of the cutter assemblies 95a and 95b by a close spacing of about 0.060 in. (1.5 mm) between the cutter assembly and the interior of the enclosure. Preferably, the spacing is no more than about 0.125 in. (3 mm) to ensure that a turbulent effect is created to propel the particles toward the vacuum inlets and away from the substrate, thereby reducing contamination of the substrate by the machining process. The flow of air carrying the particles through the enclosure to inlet 148 is indicated by the arrows in FIG. 25.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for moving electronic component substrate parts for further processing comprising the steps of:

a) providing a base, a part loading carrier for moving a part in a first direction; and at least one rod extending substantially in said first direction securing said part to said base, said rod being flexible in other directions perpendicular to said first direction so as to permit said loading carrier to adjust the position of said part in said other directions;

b) providing a carrier for receiving said part from said loading carrier, said receiving part having a pocket for capturing said part;

c) moving said rod in said other directions to adjust the position of said part on said loading carrier for alignment with the pocket on the receiving part carrier; and d) moving said loading carrier in said first direction and inserting said part into said pocket until said part is captured by said receiving carrier.

2. The method of claim 1 wherein said step (c) comprises moving said part in said other directions in response to contact with said receiving part carrier.

3. The method of claim 1 including a plurality of rods extending substantially in said first direction securing said part to said base, and wherein said step (c) comprises moving said rods and said part in said other directions in response to contact with said pocket on said receiving part carrier.

* * * * *